(12) United States Patent
Morrison et al.

(10) Patent No.: US 9,873,945 B2
(45) Date of Patent: *Jan. 23, 2018

(54) COMMON DEPOSITION PLATFORM, PROCESSING STATION, AND METHOD OF OPERATION THEREOF

(71) Applicant: Applied Materials, Inc., Santa Clara, CA (US)

(72) Inventors: Neil Morrison, Darmstadt (DE); Jose Manuel Dieguez-Campo, Hanau (DE); Heike Landgraf, Bruchkobel (DE); Tobias Stolley, Oberursel (DE); Stefan Hein, Blankenbach (DE); Florian Ries, Westerngrund (DE); Wolfgang Buschbeck, Hanau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 402 days.

This patent is subject to a terminal disclaimer.

(21) Appl. No.: 13/871,899

(22) Filed: Apr. 26, 2013

(65) Prior Publication Data

US 2014/0212600 A1    Jul. 31, 2014

(30) Foreign Application Priority Data

Jan. 31, 2013 (EP) .................................. 13153498

(51) Int. Cl.
*C23C 16/509* (2006.01)
*C23C 16/54* (2006.01)
(Continued)

(52) U.S. Cl.
CPC ...... *C23C 16/545* (2013.01); *C23C 16/45517* (2013.01); *C23C 16/45519* (2013.01);
(Continued)

(58) Field of Classification Search
None
See application file for complete search history.

(56) References Cited

U.S. PATENT DOCUMENTS 3,976,555 A * 8/1976 Von Hartel ........... C23C 14/228
                                                  204/192.12
4,461,239 A * 7/1984 Cannella ........... H01J 37/32082
                                                  118/718
(Continued)

FOREIGN PATENT DOCUMENTS

EP          2290127 A1     3/2011
JP       2004095677 A  *  3/2004
(Continued)

OTHER PUBLICATIONS

International Search Report and Written Opinion for International Application No. PCT/EP2014/05129 (17942P-WO) dated Mar. 4, 2014.

*Primary Examiner* — Karla Moore
(74) *Attorney, Agent, or Firm* — Patterson + Sheridan LLP

(57) ABSTRACT

An apparatus includes a substrate support having an outer surface for guiding the substrate through a first vacuum processing region and at least one second vacuum processing region. First and second deposition sources correspond to the first processing region and at least one second deposition source corresponds to the at least one second vacuum processing region, wherein at least the first deposition source includes an electrode having a surface that opposes the substrate support. A processing gas inlet and a processing gas outlet are arranged at opposing sides of the surface of the electrode. At least one separation gas inlet how one or more openings, wherein the one or more openings are at least provided at one of opposing sides of the electrode surface such that the processing gas inlet and/or the processing gas outlet are provided between the one or more openings and the surface of the electrode.

20 Claims, 11 Drawing Sheets

(51) Int. Cl.
*H01J 37/32* (2006.01)
*C23C 16/455* (2006.01)
*C23C 16/50* (2006.01)

(52) U.S. Cl.
CPC ........ *C23C 16/50* (2013.01); *H01J 37/32449* (2013.01); *H01J 37/32513* (2013.01); *H01J 37/32568* (2013.01); *H01J 37/32752* (2013.01); *H01J 37/32761* (2013.01); *H01J 37/3277* (2013.01)

(56) References Cited

U.S. PATENT DOCUMENTS

| | | | | |
|---|---|---|---|---|
| 4,692,233 | A | * | 9/1987 | Casey ...................... 204/298.25 |
| 4,693,803 | A | * | 9/1987 | Casey .................. C23C 14/562 |
| | | | | 204/298.24 |
| 2008/0102222 | A1 | * | 5/2008 | Fujinawa .......... C23C 16/45578 |
| | | | | 427/569 |
| 2011/0005681 | A1 | | 1/2011 | Savas et al. |
| 2011/0033638 | A1 | * | 2/2011 | Ponnekanti et al. .......... 427/569 |
| 2011/0287193 | A1 | * | 11/2011 | Creyghton et al. ........... 427/569 |
| 2014/0023796 | A1 | * | 1/2014 | Ejiri .................... C23C 14/0068 |
| | | | | 427/569 |
| 2014/0208565 | A1 | * | 7/2014 | Lotz et al. ...................... 29/428 |
| 2014/0212599 | A1 | * | 7/2014 | Buschbeck et al. .......... 427/569 |
| 2014/0290861 | A1 | * | 10/2014 | Dieguez-Campo et al. ........................ 156/345.31 |

FOREIGN PATENT DOCUMENTS

| | | | |
|---|---|---|---|
| WO | 2010047593 A1 | 4/2010 | |
| WO | WO 2012132588 A1 * | 10/2012 | ......... C23C 14/0068 |

* cited by examiner

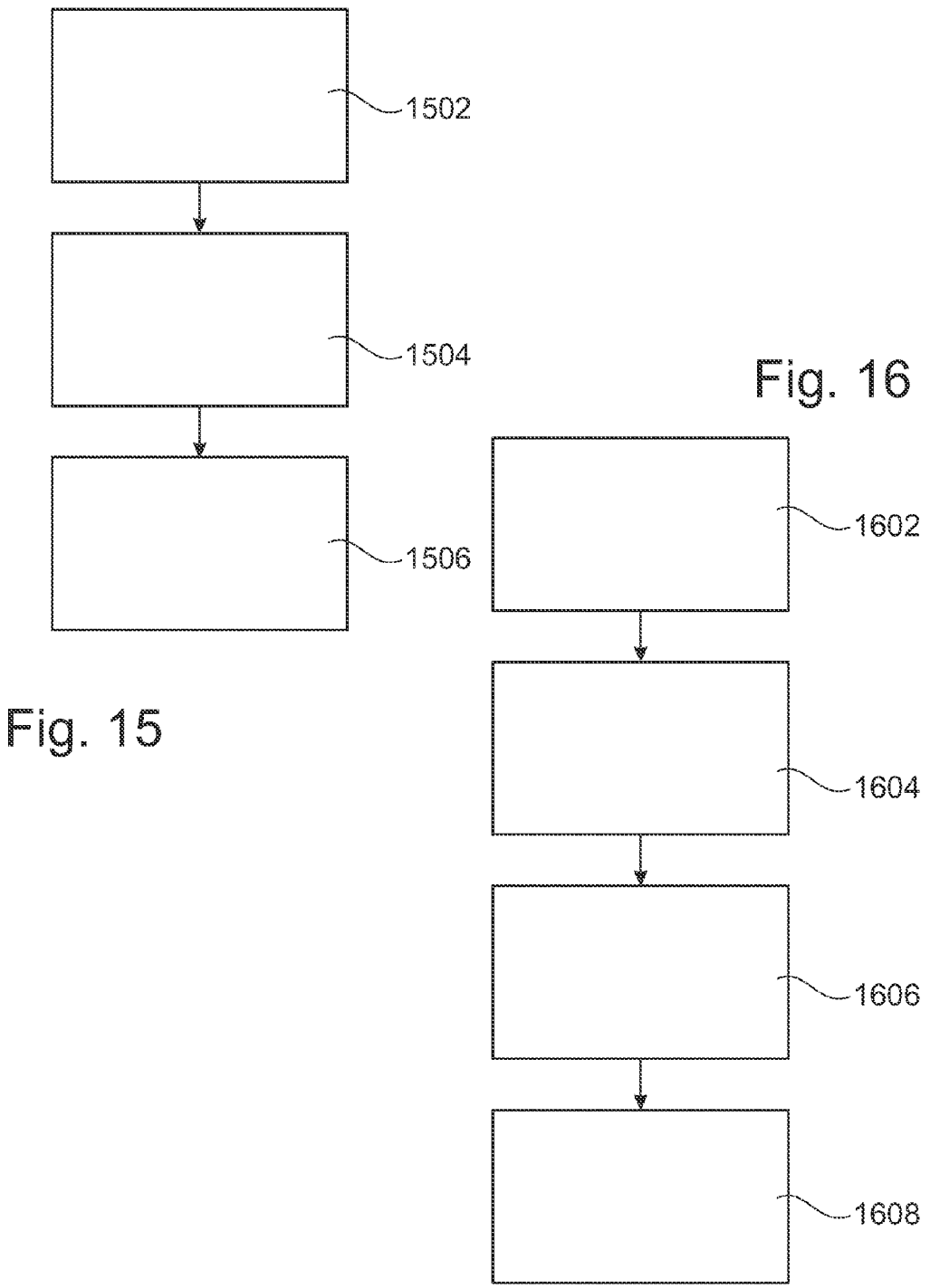

COMMON DEPOSITION PLATFORM, PROCESSING STATION, AND METHOD OF OPERATION THEREOF

TECHNICAL FIELD OF THE INVENTION

Embodiments of the present invention relate to thin-film processing apparatuses, particularly to deposition systems, and more particularly to roll-to-roll (R2R) deposition systems and methods for the operation thereof. Embodiments of the present invention particularly relate to gas separation in roll-to-roll systems and methods of gas separation therein, specifically to apparatuses for coating a thin film on a flexible substrate and methods of providing a gas separation between two deposition sources of a deposition apparatus.

BACKGROUND OF THE INVENTION

Processing of flexible substrates, such as plastic films or foils, is in high demand in the packaging industry, semiconductor industries and other industries. Processing may consist of coating of a flexible substrate with a desired material, such as a metal, in particular aluminum. Systems performing this task generally include a processing drum, e.g., a cylindrical roller, coupled to a processing system for transporting the substrate, and on which at least a portion of the substrate is processed. Roll-to-roll coating systems can, thereby, provide a high throughput system.

Typically, an evaporation process, such as a thermal evaporation process, can be utilized for depositing thin layers of metals which can be metallized onto flexible substrates. However, Roll-to-Roll deposition systems are also experiencing a strong increase in demand in the display industry and the photovoltaic (PV) industry. For example, touch panel elements, flexible displays, and flexible PV modules result in an increasing demand of depositing suitable layers in Roll-to-Roll coaters, particularly with low manufacturing costs. However, such devices typically have several layers, which are typically manufactured with CVD processes and particularly also PECVD processes.

The combination of several CVD, PECVD and/or PVD sources working with different gas mixtures and/or different working pressures faces the need of an excellent process gas separation to avoid cross contamination effects in the subsequent process steps and to ensure the long term process stability. Thereby, as compared to the state of the art, a gas separation level should beneficially be improved by at least a few orders of magnitude. Typically the deposition of complex thin film layer structures are performed subsequent in different R2R coaters, each one designed to the needs of the special deposition technique. However, this concept results in high costs of ownership (CoO) for the manufacturing equipment.

In some Roll-to-Roll coating machines, the compartments, e.g. sputter compartments, can be separated by a slit which follows the curvature of the coating drum. The gas separation is strongly dependent on the slit width between the coating drum and the gas separation unit and on the length of the slit. The optimal gas separation factor is achieved when the slit width is as small as possible. The slit width depends on the adjustment of the gas separation unit, the thickness of the plastic film and the temperature of the coating drum. Since the diameter of the coating drum increases with temperature, the gas separation slit is adjusted for the maximum specified coating drum temperature (e.g. 80° C.) and the maximum plastic film thickness (e.g. up to 500 micron). If thinner films and lower drum temperatures are to be processed with such a set-up, the only way to improve this situation is a new geometrical adjustment of the gas separation walls for the given process conditions. If this is done, the operator of the machine must be aware of the fact that under different process conditions, such as, with higher coating drum temperature, the diameter of the coating drum will expand and there is a chance that the separation walls will come into contact mechanically with the rotating coating drum. This results in a dramatic failure for the operator because the coating drum is scratched and a long and expensive re-work of the coating drum is unavoidable. Therefore, a gas separation adjustment for low coating temperatures is almost never done in real life.

OLED displays have gained significant interest recently in display applications in view of their faster response times, larger viewing angles, higher contrast, lighter weight, lower power, and amenability to flexible substrates, as compared to liquid crystal displays (LCD). In addition to organic materials used in OLEDs, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel displays (FPD), electrically pumped organic lasers, and organic optical amplifiers.

Over the years, layers in display devices have evolved into multiple layers with each layer serving a different function. Depositing multiple layers onto multiple substrates may require multiple processing chambers. Transferring multiple substrates through multiple processing chambers may decrease substrate throughput. Therefore, there is a need in the art for an efficient method and apparatus for processing such OLED structures and other modern more sophisticated devices to ensure substrate throughput is maximized and substrate transferring is decreased.

SUMMARY OF THE INVENTION

In light of the above, an apparatus for coating a thin film on a substrate according to an independent claim and a method of providing a gas separation between two deposition sources of a deposition apparatus according to an independent claim are provided. Further aspects, advantages, and features of the present invention are apparent from the dependent claims, the description, and the accompanying drawings.

According to one embodiment, an apparatus for depositing a thin film on a substrate is provided. The apparatus includes a substrate support having an outer surface for guiding the substrate along a surface of the substrate support through a first vacuum processing region and at least one second vacuum processing region, a first deposition sources corresponding to the first processing region and at least one second deposition source corresponding to the at least one second vacuum processing region, wherein at least the first deposition source includes: an electrode having a surface, wherein the surface of the electrode opposes the surface of the substrate support, a processing gas inlet and a processing gas outlet, wherein the processing gas inlet and the processing gas outlet are arranged at opposing sides of the surface of the electrode, and at least one separation gas inlet having one or more separation gas inlet openings, wherein the one or more separation gas inlet openings are at least provided at one of opposing sides of the surface of the electrode such that the processing gas inlet and/or the processing gas outlet are provided between the one or more separation gas inlet openings and the surface of the electrode. The apparatus further includes one or more vacuum flanges providing at least a further gas outlet between the first deposition source and the at least one second deposition source.

According to another embodiment, a method of depositing at least two layers on a substrate with a first deposition source and at least one second deposition source is provided. The method includes guiding the substrate over a substrate support along a surface, providing a separation gas at at least two positions at opposing sides of at least the first deposition source, providing a process gas and exhausting the process gas between the at least two positions, and pumping at at least one vacuum outlet between the first deposition source and the at least one second deposition source.

According to yet further embodiments, an apparatus for depositing a thin film on a substrate is provided. The method includes a substrate support having an outer surface for guiding the substrate along a surface of the substrate support through a first vacuum processing region and at least one second vacuum processing region, a first deposition station corresponding to the first processing region and at least one second deposition source corresponding to the at least one second vacuum processing region, wherein at least the first deposition station includes: an electrode having a surface, wherein the surface of the electrode opposes the surface of the substrate support, a processing gas inlet and a processing gas outlet, wherein the processing gas inlet and the processing gas outlet are arranged at opposing sides of the surface of the electrode, a first separation wall surround the surface of the electrode and the processing gas inlet and processing gas outlet, at least one separation gas inlet surrounding the first separation wall, and at least a second separation wall surround the at least one separation gas inlet. The apparatus further includes one or more vacuum flanges providing at least a further gas outlet between the first deposition station and the at least one second deposition source.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 15 shows a flow chart illustrating methods for gas separation and/or substrate processing, wherein the position of a source element is varied to adjust a distance of a source element from the substrate according to embodiments described herein; and FIG. 16 shows a flow chart illustrating methods for depositing a thin film on a substrate including separation gas inlet according to embodiments described herein.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

It is noted here that a flexible substrate or web as used within the embodiments described herein can typically be characterized in that it is bendable. The term "web" may be synonymously used with the term "strip" or the term "flexible substrate". For example, the web, as described in embodiments herein, may be a foil or another flexible substrate. However, as described in more detail below, the benefits of embodiments described herein may also be provided for non-flexible substrates or carriers of other inline-deposition systems. Yet, it is understood that particular benefit can be utilized for flexible substrates and applications for manufacturing devices on flexible substrates.

Figure 1:
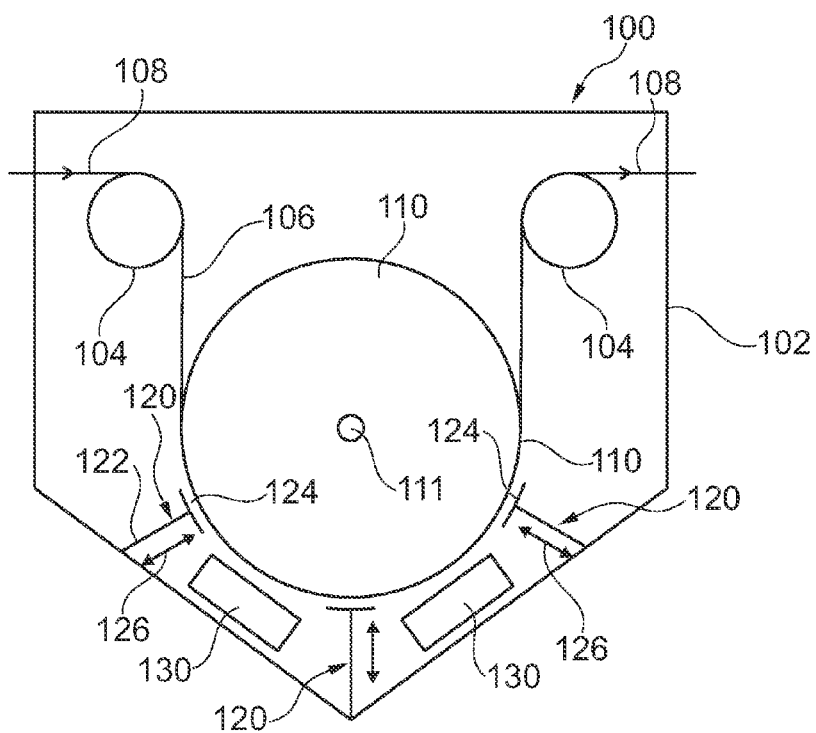
FIG. 1 shows a schematic view of a roll-to-roll deposition apparatus for depositing or coating the thin-film and having a gas separation unit according to embodiments described herein.

FIG. 1 shows a deposition apparatus 100. The deposition apparatus 100 includes a chamber 102, which can typically be provided such that the vacuum can be generated in the chamber. Thereby, various vacuum processing techniques, and particularly vacuum deposition techniques, can be used to process the substrate or to deposit the thin-film on the substrate. As shown in FIG. 1, and as referred to herein, the apparatus 100 is a roll-to-roll deposition apparatus, bearing a flexible substrate 106 being guided and processed. However, according to some embodiments, which can be combined with other embodiments described herein, the aspects, details, and features of gas separation, which are described herein, can also be applied for other deposition apparatuses, wherein a glass substrate, a wafer, or another substrate, which can also be non-flexible, or which is provided in a non-flexible carrier, is processed.

The flexible substrate 106 is guided in FIG. 1, as indicated by arrow 108, into the chamber 102. For example, the flexible substrate 106 can be guided into the chamber 102 from unwinding station. The flexible substrate is directed by the rollers 104 to a substrate support 110 configured for supporting the substrate during processing and/or deposition. As shown in FIG. 1, particularly for roll-to-roll deposition apparatuses, the substrate support can be the coating drum. From the coating drum 110, the substrate 106 is guided to a further roller 104 and out of the chamber 102, as indicated by the second arrow 108.

The embodiment depicted in FIG. 1 includes two deposition sources 130. The deposition sources are provided in processing regions, wherein the substrate being supported by the coating drum is processed in the respective areas. Yet, it is to be understood that according to yet further embodiments, which can be combined with other embodiments described herein, two or more deposition sources 130 can be provided. For example, four, five, six, or even more, such as 8, 10 or 12 deposition sources can be provided. The processing regions are separated from adjacent processing regions or further areas in the chamber 102 by gas separation unit 120.

According to embodiments described herein, the gas separation unit 120 is configured to have a varying position as indicated by arrow 126. The gas separation unit 120 typically includes a wall 122, which prevents gas in one processing region from entering a neighboring area, such as a neighboring processing region. An element 124, of the gas separation unit 120, provides the slit between the gas separation unit 120 and the substrate 106. Thereby, the element 124 defines the length of the slit and the position of the element 124 defines the width of the slit between the gas separation unit 120 and the substrate 106.

According to embodiment described herein, an apparatus for coating a thin film on a substrate is provided. The apparatus includes a substrate support having an outer surface for guiding the substrate through a first vacuum processing region from the at least one second vacuum processing region, a gas separation unit for separating the first vacuum processing region and at least one second vacuum processing region and adapted to form a slit through which the substrate can pass between the outer surface of the substrate support and the gas separation unit, wherein the gas separation unit is adapted to control fluid communication between the first processing region and the second processing region, and wherein the fluid communication is controlled by adjusting the position of the gas separation unit.

Figure 2:
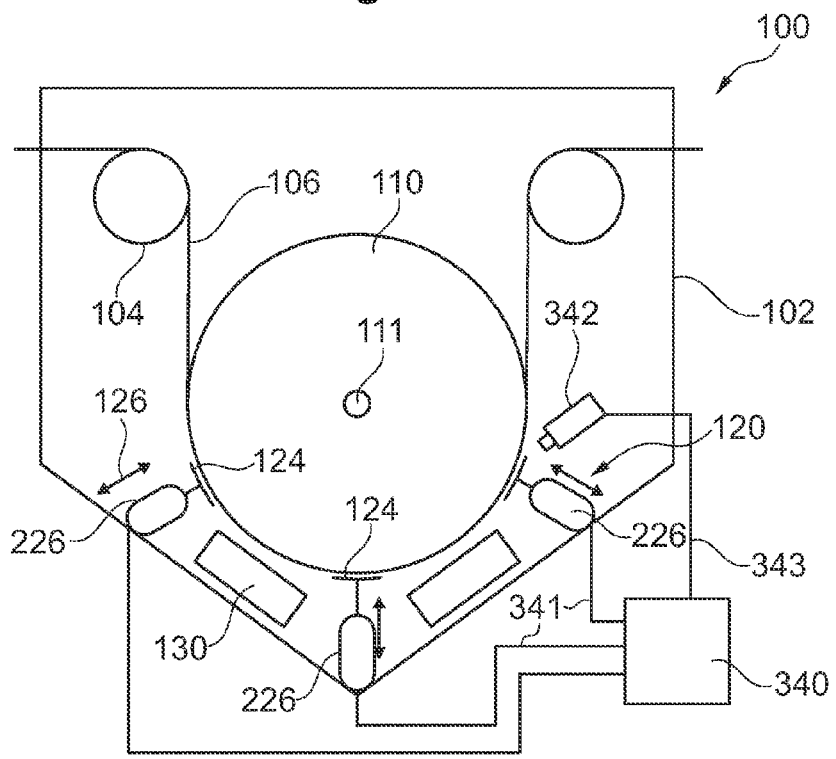
FIG. 2 shows a schematic view of a further roll-to-roll deposition apparatus for depositing or coating the thin-film and having a gas separation unit according to embodiments described herein.

FIG. 2 shows another deposition apparatus 100 and is used to describe yet further embodiments of the invention. The deposition apparatus 100, shown in FIG. 2, includes rollers 104 and a processing drum or the coating drum 110. Similarly to the example described with respect to FIG. 1, the coating drum 110 rotates around axis 111 while the substrate 106 is transported through the deposition apparatus 100. Within the chamber 102 shown in FIG. 2, the slit width monitoring device is shown in the form of the optical measurement device 342. A camera, or the like, can be used to measure the width of the slit between the gas separation unit 120 and the substrate 106. The slit width monitoring device is connected to a controller 340 by signal line 343. The controller 340 is connected with signal line 341 to actuators 226 of the respective gas separation units 120. The actuators 226 can vary the position of the gas separation units 120, and particularly of the elements 124, as indicated by arrow 126.

Figure 3A:
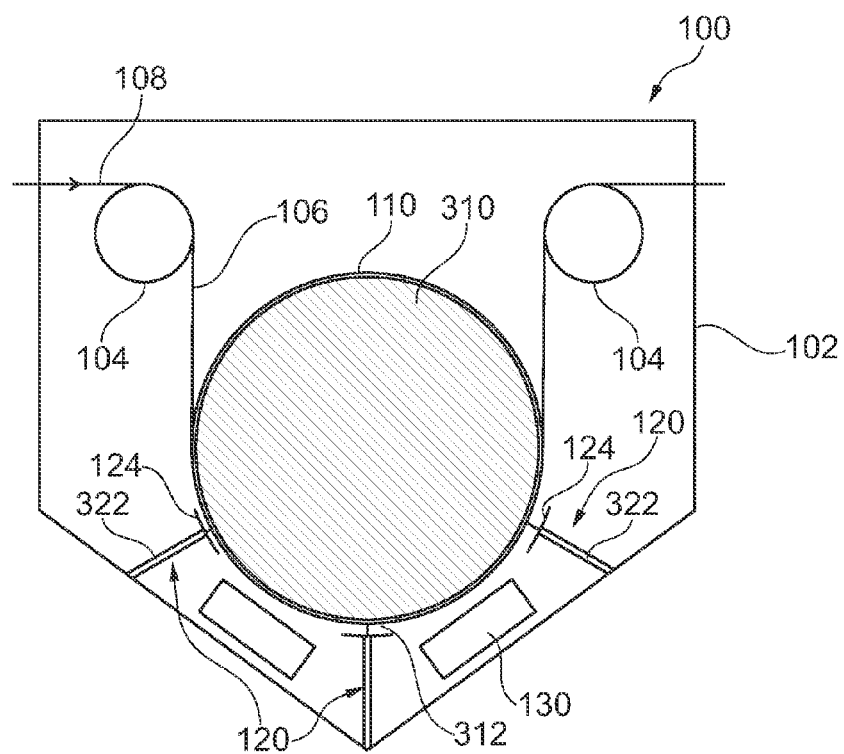
FIGS. 3A and 3B show different schematic views of a further roll-to-roll deposition apparatus for depositing or coating the thin-film and having a gas separation unit according to embodiments described herein.
Figure 3B:
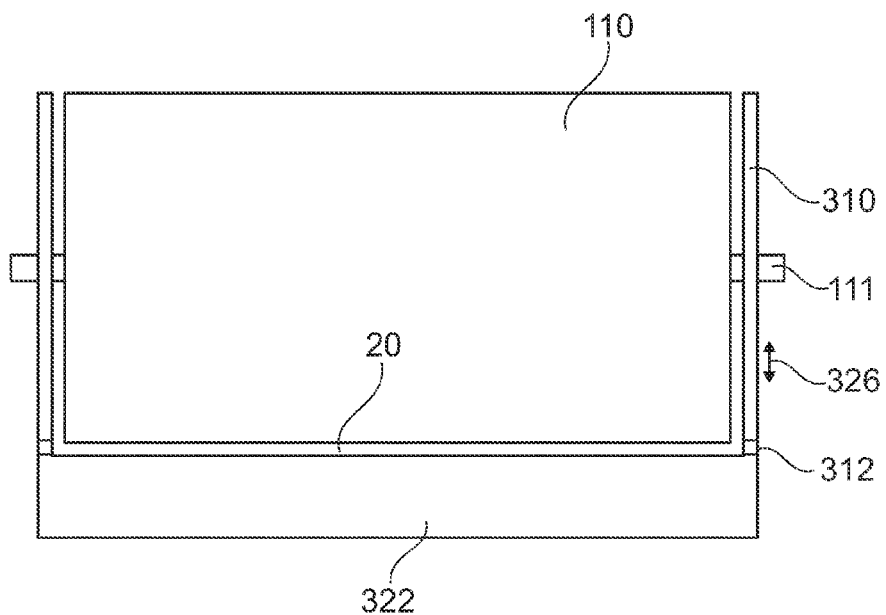

According to different embodiments, which can be combined with other embodiments described herein, an actuator 226 of a gas separation unit 120 can be selected from the group consisting of: an electrical motor, a pneumatic actuator such as a pneumatic cylinder, a linear drive, a hydraulic actuator such as an hydraulic cylinder, and a support, which has a predetermined thermal expansion coefficient when being exposed to predetermined heating or cooling, as described in more detail with respect to FIGS. 3A and 3B.

In light of the above, the slit width of the gas separation unit can be adjusted while the chamber 102 is closed and while the apparatus 100 is under operation. Accordingly, variations in the slit width, for example, due to thermal expansion of the substrate support, e.g. the coating drum 110, can be compensated for and the slit width of the gas separation unit can be adjusted to individual operation conditions.

This can be particularly useful in applications for which a high gas separation is required, e.g. PECVD processes. Accordingly, the apparatuses described herein, and having compartments for various deposition sources allow for a modular combination of several CVD, PECVD and/or PVD processes in a single deposition apparatus, e.g. a R2R coater. The modular concept, wherein all kinds of deposition sources including those which require very good gas separation, can be used in a deposition apparatus according to embodiments described herein, helps to bring down costs for the deposition of complex layer stacks that have to be deposited applying different deposition technologies or intricate combinations of process parameters.

Generally, according to different embodiments, which can be combined with other embodiments described herein, the plasma deposition source can be adapted for depositing a thin film on a flexible substrate, e.g., a web or a foil, a glass substrate or silicon substrate. Typically, the plasma deposition source can be adapted for and can be used for depositing a thin film on a flexible substrate, e.g., to form a flexible TFT, a touch screen device component, or a flexible PV module.

Further, embodiments as described herein, can be beneficial with respect to the following aspect: many process runs need low coating drum temperatures around 0° C. At low temperatures a fixed slit width, which has been adjusted for higher coating drum temperatures, is in the order of 1.5 to 2.0 mm if thin plastic film (e.g. 50 microns) is used. In this case the gas separation factor is often below the specified gas separation factor (1:100) for the machine. This is critical for process runs where layer materials are deposited with different reactive gas compositions in neighboring processing regions, e.g. sputter chambers. Where such conditions might apply is, for example, during deposition of Nb2O5 and ITO. This can be the case, for example, for touch panel manufacturing. Accordingly, the embodiments described herein can be used, in particular, for such an application of manufacturing such devices.

Embodiments described herein, provide a modified gas separation unit in deposition systems and particularly in R2R sputter coaters. The position of the gas separation unit can be adjusted, e.g. by an electrical motor or by an alternative mechanical device. The actuator for adjusting and/or varying the position of the element 124 of the gas separation unit can be remotely controlled. This can be a controller or a control interface, which is provided outside of the machine chamber. If a sensor unit, as exemplarily shown in FIG. 2, is provided for measuring the distance between coating drum and the gas separation unit, the adjustment of the slit width can be automated. Accordingly, an improved or optimized gas separation factor can always be provided. This can also prevent the risk of scratching the coating drum when the temperature of the coating drum is increased.

As mentioned above, embodiments refer to an adjustment of the gas separation unit during machine operation, particularly an automated adjustment or a "self" adjustable gas separation wall. This can also be used in inline display machines where glass substrates or carries for one or more substrates of any kind are transported from a deposition compartment to the neighboring compartment. This can apply for sputter deposition but also to CVD and PECVD deposition, and particularly applies for deposition wherein a processing gas includes a reactive gas component, wherein the reactive gas component is partly or fully incorporated in the layer to be deposited. Similar to sputter web coaters (R2R coaters) the gas separation is important for layers deposited in a reactive atmosphere. By using a self-adjustable or automatically adjustable gas separation unit, the slit width can be changed according to different thickness values of the glass substrate. An improved gas separation factor can also have an impact on the design of the coating machine. The length of the gas separating units between two compartments can be reduced, i.e. the length of the slit and/or of the element 124 shown e.g. in FIGS. 1 and 2, can be reduced. This has an impact which reduces length, costs and footprint of the machine.

According to yet further embodiments for operating and using deposition apparatuses as described herein, deposition of layers or a stack of layers for ultra high barrier stacks or flexible TFT devices can be provided. Ultra high barrier stacks or flexible TFT devices are typically composed of a series of layers, which are typically deposited with PECVD or PVD processes or combinations thereof. Because of the high demands on the quality of the different films it is common use to deposit the single films in specially designed systems for each single film. To bring down costs and make the applications commercially available, it is an improvement to combine the deposition of at least sets or combinations of films in one single coater. According to embodiments described herein, a modular concept which allows the combination of several process modules is provided. Thereby, according to embodiments described herein, the gas or process separation can be realized over a combination of one or more different techniques, which allow for a gas separation with a separation factor being significantly higher as compared to prior systems, and particularly even for variations of different processes being conducted on the same apparatus. In light of the above, according to some embodiments described herein, flexible ultra high barriers for OLED display and/or lighting, flex solar, or other electronic devices with the need for protection from an adjacent environment can be provided. For example, this can include the deposition of etch stop, gate dielectric, channel, source gate and drain electrodes for flexible TFT.

A further deposition apparatus 100 is described with respect to FIGS. 3A and 3B. Similarly to the previously described apparatuses, the substrate 106 is guided as indicated by arrow 108 over rollers 104 and coating drum 110. Deposition sources 130 are provided in processing regions. The processing regions are separated by gas separation units 120. According to some embodiments, which can be combined with other embodiments described herein, the width of the slit between the gas separation unit 120 and the substrate 106, which is defined by the element 124 of the gas separation unit 120 can be adjusted by the support arrangement of the gas separation unit. FIGS. 3A and 3B show the discs 310, which have essentially the same diameter as the coating drum 110. Even though the coating drum 110 is drawn to be slightly larger in FIG. 3A, this is mainly for illustrating purposes as the coating drum 110 and the discs 310 can have the same diameter. The disc 310 is mounted to the axis 111. Thereby, the disc 310 remains stationary during rotation of the coating drum 110, i.e. the disc 310 does not rotate together with the coating drum.

The gas separation unit or the respective wall element 322 is connected to the disc 310 by connection element 312. Thereby, according to some embodiments, the connection element 312 determines the width of the slit 20. According to alternative embodiments, which can be combined with other embodiments described herein, the disc 310, the connection element 312 and the wall element 322 can also be provided as one integral unit, or the disc 310 and the connection element 312, or the wall element 322 and the connection element 312 can be provided as one integrally formed unit.

If the temperature of the coating drum 110 varies, the diameter of the coating drum 110 varies. Accordingly, the width of the slit 20 is affected by the variation of the diameter of the coating drum and, according to embodiments described herein, an adjustment of the width of the slit can be provided. The support of the gas separation unit 120 having a disc 310 and the connection element 312, which can optionally be integrally formed with the disc 310, provides for an adjustment of the width of the slit 20 as indicated by arrow 326. Thereby, according to some embodiments, the disc 310 can be passively heated or passively cooled by the coating drum 110. Thereby, the disc 310 can be provided at a temperature which is essentially the same as the temperature of the coating drum 110 for example, the temperature of the disc 310 can vary from the temperature of the coating drum 110 by +−10° C. Accordingly, the disc 310 also experiences the thermal expansion such that thermal expansion of the coating drum 110 is followed by the thermal expansion of the disc 310.

According to yet further embodiments, which can be combined with other embodiments described herein, additionally or alternatively, the disc 310 or a similar support for the gas separation unit 120 can be provided with cooling channels or heating elements. Thereby, the temperature of the disc 310 can be individually controlled. Accordingly the thermal expansion of the disc 310 can be controlled independently of the temperature of the coating drum. Thereby, the width of the slit 20 can be adjusted.

With respect to the temperature of the coating drum or processing drum the following aspects can be considered.

$$l = l_0 \cdot (1 + \alpha \cdot \vartheta)$$

$$l_0 = \text{length at } \vartheta = 0° \text{ C}.$$

$$\vartheta_{disk} = \frac{\alpha_{drum}}{\alpha_{disk}} \cdot \vartheta_{drum}$$

With a thermal expansion coefficient of stainless steel $\alpha ss=0.000016$ K$^{-1}$ and of aluminum $\alpha Al=0.0000238$ K$^{-1}$, $\alpha drum/\alpha disk=0.6723$ can be obtained. Thereby, for example, a disk temperature of 268.91° C. can be provided to correspond to a drum temperature of 400° C. and to compensate for the thermal expansion of the drum at 400° C.

For some embodiments, when the disc 310 consists of a material which has the same thermal expansion coefficient as the coating drum 110 or consists of the same material as the coating drum 110, and if the temperature of the disc 310 can be controlled to be essentially the same as the temperature of the coating drum 110, then the thermal expansion (see, for example arrow 326) is essentially the same. Thus, the width of the slit 20 varies only by the thermal expansion of the connection element 312. First, the length of the connection element 312 is shorter as compared to the radius of the coating drum. Accordingly, the variation of the slit widths to thermal expansion is significantly reduced. Secondly, according to some embodiments, it is possible to select the material of the connection element 312 with a low thermal expansion coefficient, such that the influence of the temperature on thermal expansion of the connection element 312 can be further reduced.

According to yet further embodiments, which can be combined with other embodiments described herein, the material of the disc 310 can be selected to be different than the material of the coating drum and can be selected to have a different thermal expansion coefficient as compared to the coating drum. Thereby, the thermal expansion of the disc 310, which corresponds to thermal expansion of the coating drum 110, can be provided by different temperatures, such that there is no necessity to provide the same temperature at the disc 310 as compared to the coating drum 110. Yet further, particularly if the disc 310 and the connection element 312 are integrally formed, a different thermal expansion coefficient can also compensate for the larger radial dimension of the disc 310 in combination with the connection element 312. Generally, as mentioned above, it is possible to adjust the width of the slit 20 by regulating or adapting the temperature of the disc 310 independent of the radial dimension of the disc 310 or the material it is made from.

FIGS. 3A and 3B refer to the disc 310 which is a circle similar to that of the coating drum 110. However, according to yet further embodiments, which can be combined with other embodiments described herein, the support element for supporting the gas separation unit 110 can also be a portion of the disc, a rod, or another shape. Typically the support of the gas separation unit 120 is connected to the axis 111 such that the thermal expansion as indicated by arrow 326 results in increasing temperatures and elongation in the same direction as compared to the coating drum 110.

Even though the above described aspects and details refer to thermal expansion, a shrinkage can also be provided during operation, for example, if after a first process at higher temperatures, the processing drum or coating drum is cooled to lower temperatures. Accordingly, it is understood, that the term "expansion" refers to the behavior resulting from the thermal expansion coefficient of an element, i.e. the thermal expansion can have a positive or a negative sign.

Figure 4:
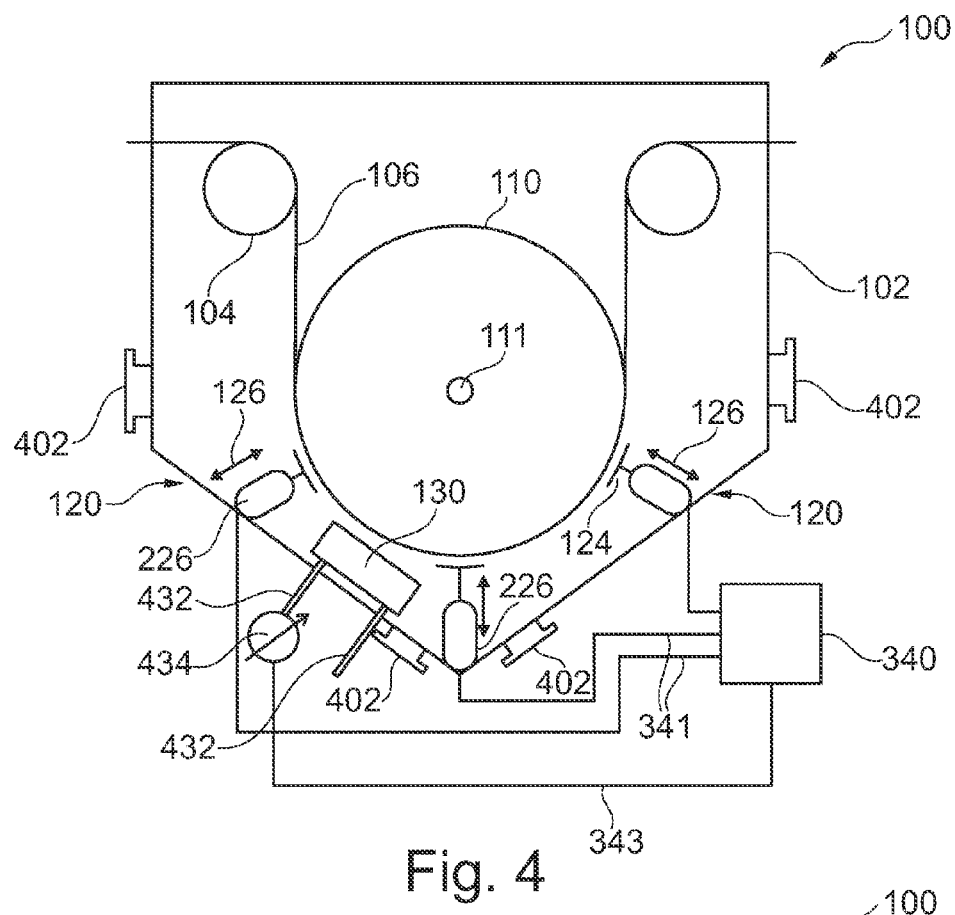
FIG. 4 shows a schematic view of a further roll-to-roll deposition apparatus for depositing or coating the thin-film and having a gas separation unit according to embodiments described herein.

FIG. 4 shows a yet further deposition apparatus 100. Similarly to the other deposition apparatuses described herein, the substrate 106 is guided via rollers 104 and coating drum 110 through two or more processing regions. Thereby, the coating drum 110 rotates around axis 111. FIG. 4 shows three gas separation units 120, wherein an actuator 226 moves element 124 as indicated by arrow 126. The gas separation units 120 form two or more processing regions and further regions in the chamber 102. According to typical embodiments, which can be combined with other embodiments described herein, each of the processing regions and the further areas can be evacuated independent from each other. For example, as shown in FIG. 4, each of the areas has a vacuum flange 402. The deposition apparatus 100 is configured such that one or more vacuum pumps or a vacuum pump arrangement can be connected to each of the respective vacuum flanges 402. Accordingly each processing region and/or each further area can be evacuated independently and according to the desired processing conditions.

According to yet further embodiments, which can be combined with other embodiments described herein, the one or more deposition sources 130 are provided with connections 432. The connections 432 can be electrical connections and/or connections for input and output of processing gas. According to some embodiments, which can be combined with other embodiments described herein, one or more monitoring devices 434 can be provided for the deposition sources 130.

Typically, a monitoring device can be a device measuring the electrode voltage, electrode current, and plasma impedance at the deposition source, e.g. after the match circuit. Additionally or alternatively, also the gas flow into the processing region of the deposition source and out of the processing region of the deposition source can be monitored. For example the pressures at the respective conduits and/or even the gas mixture could be analyzed. If the width of the slits increases, the gas separation factor decreases and process gases of the adjacent processing regions can enter thereby changing the gas pressure and the gas mixture and, thus, the plasma conditions vary. The monitoring device 434, such as a monitoring device measuring the electrode voltage, electrode current, and plasma impedance measured at the deposition source can be utilized for determining the plasma conditions. In light of the fact that the plasma conditions vary if the diameter of the coating drum 110 increases, for example, due to thermal expansion, a plasma monitor can be utilized for determining the slit width of between the source and the coating drum, i.e. the substrate support, and thereby, also the slit width of one or more of the gas separation units.

One or more corresponding signals relating to the slit width and/or the plasma condition can be provided by signal line 343 to controller 340. The controller 340 is connected, as shown in FIG. 4, by signal line 341 to actuators 226. Accordingly the slit width of the gas separation units can be adjusted accordingly. The actuator 226 can be any kind of actuator described with respect to other embodiments described herein. For example, this includes the temperature control of the support for the gas separation unit, wherein the support is connected to the axis 111 of the coating drum, such that the thermal expansion of the support can be controlled by temperature adjustment of the support.

According to some embodiments, which can be combined with other embodiments described herein, the monitoring device can be a CVD process monitor. For example, the monitoring device can measure at least one of the group consisting of: the voltage, the current, the phase, the harmonics, the impedance or, by using an algorithm, the plasma density, of the deposition source. Corresponding plasma monitoring devices can be used for endpoint detection of cleaning processes, notification of silane dust formation, and for real-time non-invasive process feedback, e.g. in the form of plasma density for system controlled algorithm. However, according to some embodiments described herein, additionally the monitoring device can be utilized for determining the distance of an electrode of the PECVD source from the substrate and/or the corresponding counter electrode provided behind the substrate, for example the coating drum. Yet, further process gas variations due to a varying slit width of the gas separation device can also be measured with the monitoring device.

Accordingly, a non-invasive plasma characterization method can be provided by an impedance sensor measurement. According to different embodiments, the impedance sensor can be used either as a pre-match or a post-match sensor, i.e. for the match circuit or after the match circuit. Thereby, a post-match mounting of the monitoring sensor provides direct information on RF voltages on the electrodes and the actual plasma impedance. Typically, an electronic "fingerprint" of the plasma can be provided, wherein also the distance of the electrode from the substrate or process gas contamination from adjacent regions can be determined. The differences in phase angle and/or harmonic signal amplitude can show subtle changes in process conditions, for example onset of process drifts. Accordingly, indirect information on ion flux incident at powered electrode surfaces and, hence, plasma density can be provided, particularly by measurement of the harmonics in the system of powering the deposition source.

According to some embodiments, which can be combined with other embodiments described herein, the plasma enhanced deposition sources can be operated at a frequency of 2 MHz to 90 MHz, for example a frequency of 40.68 MHz, and an integrated impedance sensor can provide for real time in-line process monitoring and control of respective process parameters, for example, the width of the slit of the gas separation unit and/or the distance of the electrode of the deposition source from the substrate.

Figure 5:
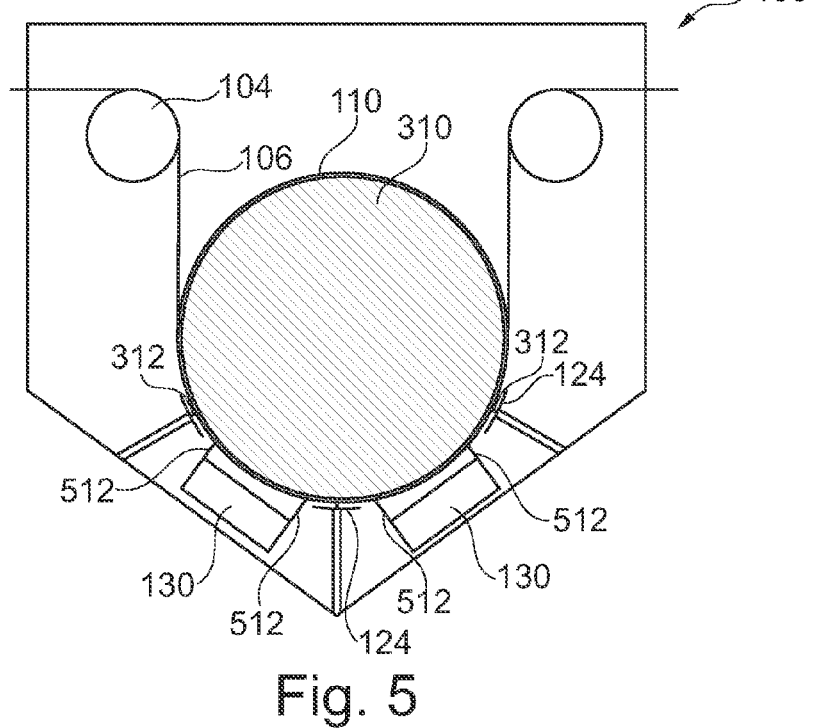
FIG. 5 shows a schematic view of a further roll-to-roll deposition apparatus for depositing or coating the thin-film and having a gas separation unit according to embodiments described herein.

FIG. 5 illustrates a yet further deposition apparatus 100. Thereby, the deposition apparatus shown in FIG. 5 corresponds mainly to the deposition apparatus shown in FIG. 3A. Details, aspects, features, and embodiments described with respect to FIG. 3A can also be implemented with respect to the deposition apparatus 100 shown in FIG. 5 and are omitted to avoid repetition. Additionally, according to some embodiments, which can be combined with other embodiments described herein, the deposition sources 130 or at least one deposition source 130 can be provided with a support element 512. Thereby, the support element 512 is mechanically connected to the disc 310 or another corresponding support as described with respect to FIGS. 3A and 3B. In light of the connection of the support element 512 to the disc 310, the deposition source 130 follows the thermal expansion or contraction of the disc 310. Accordingly, according to some embodiments, the position of the deposition source can vary. Typically the position of the deposition source 130 varies depending of the temperature of the coating drum. Accordingly, an adjustment of the distance between the deposition source and the substrate can be provided according to embodiments described herein.

Figure 13A:
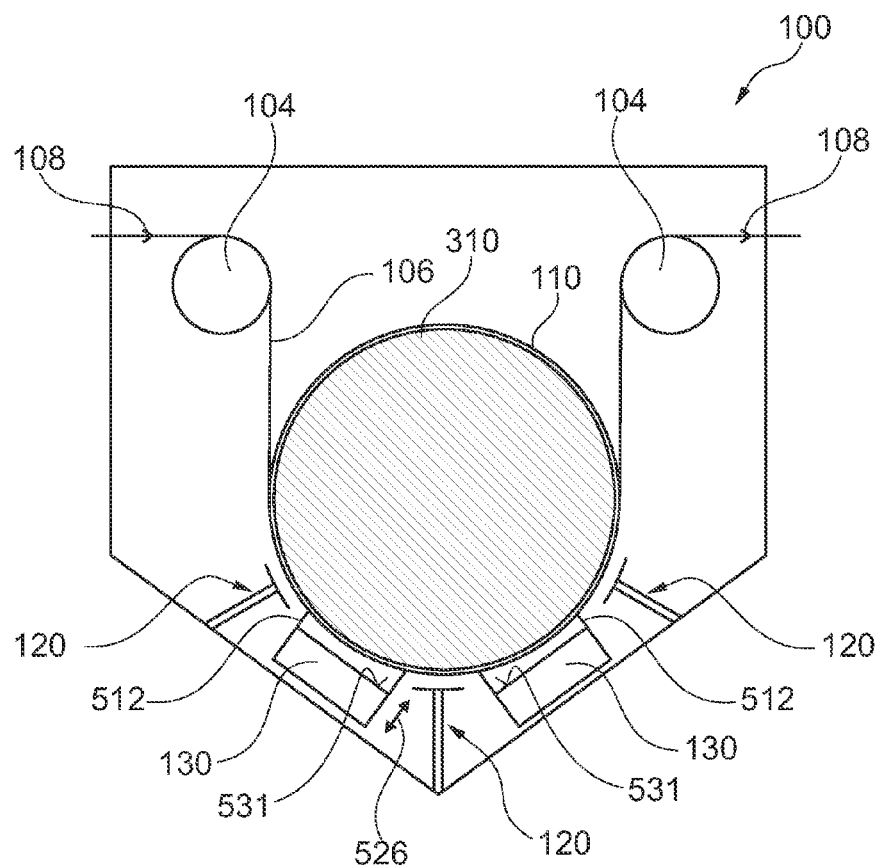
FIGS. 13A and 13B show different schematic views of a further roll-to-roll deposition apparatus for depositing or coating the thin-film and having a plasma deposition source according to embodiments described herein.
Figure 13B:
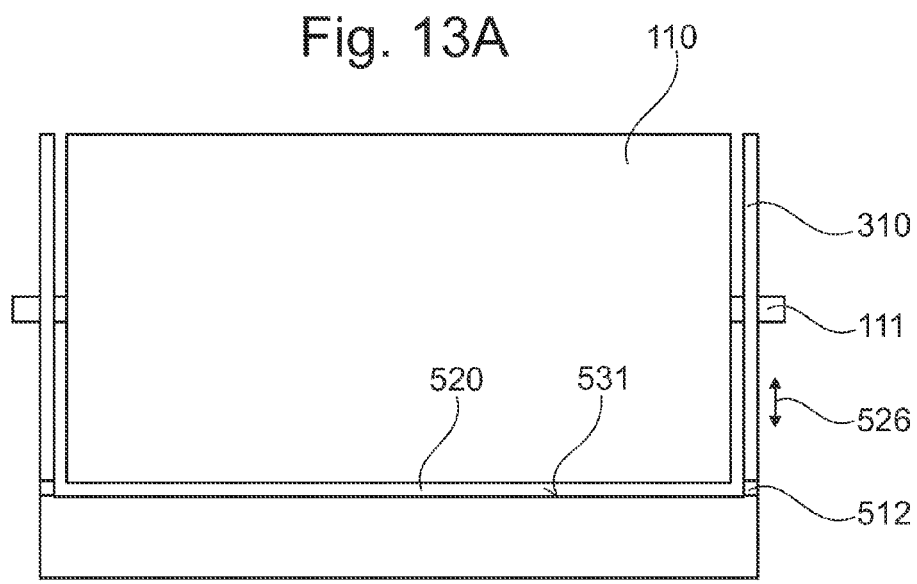

A further deposition apparatus 100 is described with respect to FIGS. 13A and 13B. Similarly to the previously described apparatuses, the substrate 106 is guided as indicated by arrow 108 over rollers 104 and coating drum 110. Deposition sources 130 are provided in processing regions. The processing regions can be separated by gas separation units 120. Typically, the deposition sources include an electrode 531 facing the substrate support or the substrate respectively. Accordingly, the deposition source or the electrode 531, respectively, and the substrate 106 are at opposing sides of a vacuum processing region in which a plasma is ignited during thin film deposition.

According to some embodiments, which can be combined with other embodiments described herein, the width of the slit between the electrode 531 and the substrate 106, i.e. the width of the vacuum processing region, can be adjusted by the support arrangement of the gas separation unit. FIGS. 13A and 13B show the discs 310, which have essentially the same diameter as the coating drum 110. Even though the coating drum 110 is drawn to be slightly larger in FIG. 13A, this is mainly for illustrating purposes as the coating drum 110 and the discs 310 can have the same diameter. The disc 310 is mounted to the axis 111. Thereby, the disc 310 remains stationary during rotation of the coating drum 110, i.e. the disc 310 does not rotate together with the coating drum.

The deposition source, the electrode of the deposition source or a respective element of the deposition source 130 is connected to the disc 310 by support element 512, e.g. a connection element. Thereby, according to some embodiments, the connection element determines the width of the processing region 520. According to alternative embodiments, which can be combined with other embodiments described herein, the disc 310 and the connection element can also be provided as one integral unit.

If the temperature of the coating drum 110 varies during substrate processing, for example deposition of the thin film on the substrate, the diameter of the coating drum 110 varies. Accordingly, the width of the vacuum processing region 520 is affected by the variation of the diameter of the coating drum and, according to embodiments described herein, an adjustment of the distance between the electrode and the substrate, i.e. the width of the vacuum processing region can be provided. The support of the plasma deposition source 130 or the respective electrode 531, having a disc 310 and a support element 512, e.g. the connection element, which can optionally be integrally formed with the disc 310, provides for an adjustment of the width of the processing region 520 as indicated by arrow 526. Thereby, according to some embodiments, the disc 310 can be passively heated or passively cooled by the coating drum 110. Thereby, the disc 310 can be provided at a temperature which is essentially the same as the temperature of the coating drum 110, for example, the temperature of the disc 310 can vary from the temperature of the coating drum 110 by +−10° C. Accordingly, the disc 310 also experiences the thermal expansion such that thermal expansion of the coating drum 110 is followed by the thermal expansion of the disc 310.

According to yet further embodiments, which can be combined with other embodiments described herein, additionally or alternatively, the disc 310 or a similar support for the plasma deposition source 130 can be provided with cooling channels or heating elements. Thereby, the temperature of the disc 310 can be individually controlled. Accordingly the thermal expansion of the disc 310 can be controlled independently of the temperature of the coating drum. Thereby, the width of the distance between the electrode and the substrate or the substrate support surface, respectively, can be adjusted.

For some embodiments, when the disc 310 consists of a material which has the same thermal expansion coefficient as the coating drum 110, or consists of the same material as the coating drum 110, and if the temperature of the disc 310 can be controlled to be essentially the same as the temperature of the coating drum 110, the thermal expansion (see, for example arrow 326) are essentially the same. Thus, the width of the slit 20 varies only by the thermal expansion of the support element 512, e.g. connection element. First, the length of the connection element is shorter as compared to the radius of the coating drum. Accordingly, the variation of the slit widths to thermal expansion is significantly reduced. Secondly, according to some embodiments, it is possible to select the material of the connection element with a low thermal expansion coefficient, such that the influence of the temperature on thermal expansion of the connection element can be further reduced.

According to yet further embodiments, which can be combined with other embodiments described herein, the material of the disc 310 can be selected to be different than the material of the coating drum and can be selected to have a different thermal expansion coefficient as compared to the coating drum. Thereby, the thermal expansion of the disc 310, which corresponds to thermal expansion of the coating drum 110, can be provided by different temperatures, such that there is no necessity to provide the same temperature at the disc 310 as compared to the coating drum 110. Yet further, particularly if the disc 310 and the support element 512, e.g. a connection element are integrally formed, a different thermal expansion coefficient can also compensate for the larger radial dimension of the disc 310 in combination with the connection element.

FIGS. 13A and 13B referred to the disc 310 which is a circle similar to the coating drum 110. However, according to yet further embodiments, which can be combined with other embodiments described herein, the support element for supporting the deposition source or the electrode of the deposition source, respectively, can also be a portion of the disc, a rod, or another shape. Typically the support is connected to the axis 111 such that the thermal expansion as indicated by arrow 526 results in increasing temperatures in and elongation in the same direction as compared to the coating drum 110.

Even though the above described aspects and details refer to thermal expansion, a shrinkage can also be provided during operation, for example, if after a first process at higher temperatures, the processing drum or coating drum is cooled to lower temperatures. Accordingly, it is understood, that the term "expansion" refers to the behavior resulting from the thermal expansion coefficient of an element, i.e. the thermal expansion can have a positive or a negative sign.

As previously described with respect to FIG. 5, at least one deposition source 130 can be provided with a support element 512 and a gas separation unit 120 can be provided with a support 312. Thereby, the support 312 is mechanically connected to the disc 310 or another corresponding support as described with respect to FIGS. 13A and 13B. In light of the connection of the support 312 to the disc 310, the gas separation unit 120 follows the thermal expansion or contraction of the disc 310. Accordingly, according to some embodiments, the position of the gas separation unit can also vary as described herein.

Figure 6:
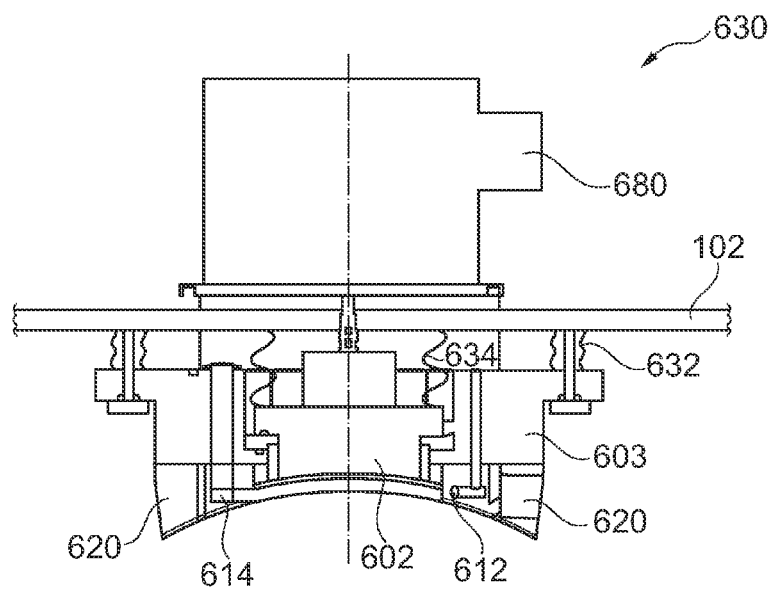
FIG. 6 shows a schematic view of a deposition source as used in roll-to-toll deposition systems and apparatuses according to embodiments described herein.

FIG. 6 shows a deposition source 630 and is used to describe yet further embodiments of deposition sources according to embodiments described herein. The deposition source 630 includes a main body 603. An electrode 602 is supported by the main body. The electrode 602 is connected to the match circuit 680 for plasma generation in the processing regions of the deposition source 630. Thereby, a plasma can be generated during operation between the electrode 602 and the substrate. The deposition source further includes a gas inlet 612 for providing a processing gas mixture into the processing region and an evacuation outlet 614 for removing the processing gas mixture from the processing region. Accordingly the processing gas flows from inlet 612 to outlet 614. FIG. 6 shows a schematic cross-sectional view of a deposition source 630. Typically, the processing gas inlet and processing gas outlet can extend in the direction perpendicular to the paper plane of FIG. 6. Thereby, a plurality of openings or a slit opening can be provided. Typically, the processing gas inlet and outlet is provided to extend at least along the width of the substrate to be processed and/or at least along the desired length of the processing region. Typically, the inlet and outlet will extend at least slightly beyond the maximum substrate width in order to provide uniform conditions in the area to be coated.

According to some embodiments, which can be combined with other embodiments described herein, the deposition source and the gas separation units can be formed as one arrangement. For example, FIG. 6 shows the separation gas unit 620 mounted to the body 603 of the deposition source. Thereby, an adjustment of the slit width of the gas separation unit and an adjustment of the distance between the electrode 602 and the substrate can be provided in a combined manner.

As shown in FIG. 6, the deposition source can be connected to the wall portion 102 such that the distance of the body 603 and the wall 102 can vary. This is indicated by bellows 632 and 634. Accordingly, the main body 603, the electrode 602, and/or the gas separation unit 620 can be supported with a support being in mechanical contact with the axis of the coating drum. Thereby, the slit width of the gas separation unit as well as the distance between the electrode 602 and the substrate can be adjusted. This is for example described with respect to FIG. 5 and is in accordance with various embodiments described herein. Yet further, alternatively, an actuator can be provided between the main body 603 of the deposition source 630 and the wall 102 such that the position of the main body, and, thereby, of the gas separation unit and the electrode, can be varied for adjustment of the distance to the substrate.

Figure 7:
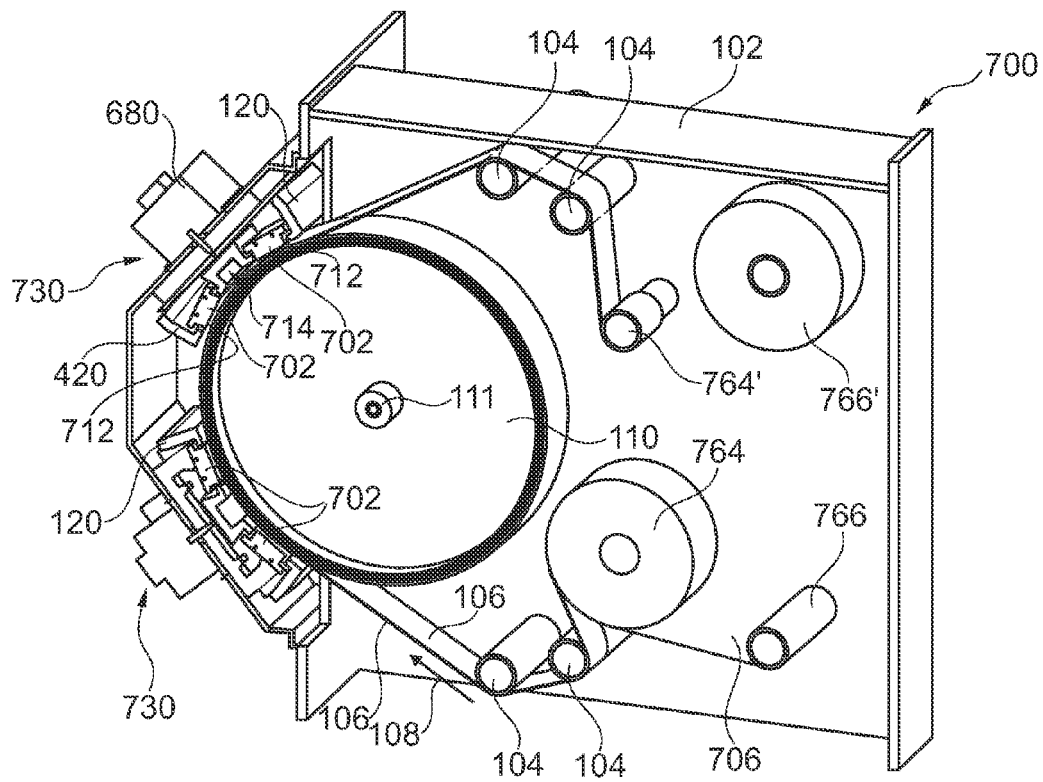
FIG. 7 shows a schematic view of a further roll-to-roll deposition apparatus for depositing or coating the thin-film on a flexible substrate according to embodiments described herein.

FIG. 7 shows a further deposition apparatus 700. The flexible substrate 106 is provided on a first roll 764, e.g. having a winding shaft. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. The flexible substrate 106 is unwound from the roll 764 as indicated by the substrate movement direction shown by arrow 108. Upon unwinding of the flexible substrate 106 from the roll 764 the interleaf 706 is wound on the interleaf roll 766.

The substrate 106 is then moved through the deposition areas provided at the coating drum 110 and corresponding to positions of the deposition sources 730. During operation, the coating drum 110 rotates around axis 111 such that the substrate moves in direction of arrow 108. According to typical embodiments, the substrate is guided via one, two or more rollers 104 from the roll 764 to the coating drum and from the coating drum to the second roll 764', e.g. having a winding shaft, on which the substrate is wound after processing thereof. After processing, a further interleaf can be provided from interleaf roll 766' between the layers of the flexible substrate 106, which is wound on to the roll 764'.

The substrate 106 is coated with one or more thin films, i.e. one or more layers are deposited on the substrate 106 by deposition sources 730. The deposition takes place while the substrate is guided on the coating drum 110. The deposition sources 730, shown in FIG. 7, and which can be provided in embodiments described herein, include two electrodes 702, which are electrically connected to match circuit 680 for providing power to the electrodes. The deposition source 730 according to some embodiments described herein, can include two gas inlets 712 at the opposing sides of the deposition source and a gas outlet 714 between the two electrodes 702. Accordingly, a gas flow of processing gas can be provided from the outer portions of that deposition source 730 to the inner portion of that deposition source. As shown in FIG. 7 and according to some embodiments described herein, the substrate transport direction 108 is parallel to a gas flow direction.

According to different embodiments, which can be combined with other embodiments described herein, the gas inlets or gas outlets may be provided as gas lances, gas channels, gas ducts, gas passages, gas tubes, conduits, etc. Furthermore, a gas outlet may be configured as a part of a pump which extracts gas from the plasma volume.

Gas separation units 120 are provided on at least one, typically both sides of the deposition source. Thereby, the slit width of the gas separation units, i.e. the distance between elements, such as elements 124 shown in FIGS. 1 to 5 of the gas separation unit, and the substrate can be adjusted according to any of the embodiments described herein. Additionally, also the distance of the electrode 702 with respect to the substrate can be adjusted. Thereby, the support of the gas separation unit and, optionally the deposition source having the electrode therein, can be provided for adjustment of the distance to the substrate.

As described inter alia with respect to FIGS. 6 and 7, embodiments described herein refer inter alia to a plasma deposition system for depositing, from a plasma phase, thin films onto a moving substrate. The substrate may move in a substrate transport direction in a vacuum chamber where a plasma deposition source for transferring a deposition gas into a plasma phase and for depositing, from the plasma phase, a thin film onto the moving substrate is located.

As shown in FIG. 7, and in accordance with embodiments described herein, a plasma deposition source 630 can be provided as a PECVD (plasma-enhanced chemical vapor deposition) source having a multi-region electrode device including two, three or even more RF electrodes 702 arranged opposite to a moving substrate.

The individual electrodes 702 each have an electrode width and an electrode length, wherein the electrode width is measured in a direction parallel to the substrate transport direction 108 and wherein the electrode length is measured in a direction perpendicular to the substrate transport direction 108 of the moving substrate 106.

The electrode area corresponds to a plasma region such that the plasma regions of the at least two electrodes 702 form a combined plasma region, which is located in one vacuum processing region. The electrode width may be determined on the basis of plasma parameters such as deposition gas flow, plasma pressure, RF power and RF frequency provided at the respective RF electrode, and a deposition gas depletion profile. According to yet further embodiments, multi region plasma deposition sources can also be provided for MF deposition.

The electrode length of an individual electrode 702 may be adjusted such that the electrode length exceeds a lateral dimension of the moving substrate perpendicular to the substrate transport direction. Albeit mainly plasma deposition processes are described in the present disclosure, it is to be understood that the plasma deposition source in accordance with embodiments described herein may also be used for plasma enhanced etching processes, plasma-enhanced surface modification processes, plasma-enhanced surface activation or deactivation processes, and other plasma-enhanced processes known to the skilled person.

It is noted here that the term "gas inlet" denotes a gas supply into a deposition region (a plasma volume or processing region), whereas the term "gas outlet" denotes a gas discharge or evacuation of deposition gas out of a deposition region. The gas inlet 712 and the gas outlet 714, according to a typical embodiment, are arranged essentially perpendicular to the substrate transport direction.

According to some embodiments, which can be combined with other embodiments described herein, the deposition source 730 shown in FIG. 7 can be operated at the frequency of 40.68 MHz. Thereby, efficient power coupling to the plasma electrodes can be achieved and the ion bombardment energies can be reduced, which results in less film damage. This can be particularly useful for sensitive flexible substrates such as foils or the like. The twin-electrode source having electrodes 702 operates without a showerhead and process gases can be introduced from the electrode sides, whereas the pumping of the side of an electrode results in a flow of the processing gas mixture along the moving substrate. According to some embodiments, which can be combined with other embodiments described herein, two electrodes can be driven in parallel with one power supply and one matching network, i.e. matching circuit. It is yet further possible to also provide additional electrodes in order to scale up the deposition source.

Generally, embodiments described herein are particularly useful if different processes, e.g. with different process gases such as $H_2$ and $SiH_4$, are to be conducted in adjacent processing regions or chambers. Thereby, an undesired flow from one processing region to the other processing region and vice versa needs to be avoided. For some of the applications referred to herein and for which embodiments described herein are beneficial, e.g. flexible TFT, flexible PV, etc., a separation factor of 10000 or above needs to be provided, which is not possible with common gas separation units. According to some embodiments, the slit width of a gas separation unit can be varied, as described herein. Additionally or alternatively a purge gas arrangement can be provided. Thereby, the purge gas can also be referred to as a separation gas. A typical example of a purge gas can be H2, a noble gas such as argon, or nitrogen. The purge or separation gas flows in the slits in a direction, which is directed in an opposite direction as the undesired gas flow of processing gases. Thus, according to some embodiments, a gas separation can be provided by an intermediate space or intermediate area between two processing electrodes, wherein an inlet of a purge or separation gas and an evacuation or suction outlet is provided.

According to typical embodiments, which can be combined with other embodiments described herein, if a suction or evacuation duct is included, which is provided between adjacent vacuum processing regions, the pressure in the area where the suction or evacuation duct is provided is lower than in any of the surrounding processing regions. Thereby, it can be avoided that contamination gases from the area of the suction or evacuation duct can enter any of the processing regions. However, this results in a high flow rate of processing gas towards the suction or evacuation duct. Accordingly, the loss of processing gas, and particularly unused processing gas is increased. This, in turn results in an increased CoO.

In order to avoid unnecessary process gas consumption of the deposition apparatuses described herein, one or more intermediate gas inlet areas for inlet of a purge gas are provided. Typically, the one or more intermediate gas inlet areas can be provided such that they surround the processing regions. Typically, the purge gas or separation gas can be hydrogen, or another gas which is used as a processing gas in the processing region. According to typical embodiments, which can be combined with other embodiments described herein, the flow rate of the purge gas is adjusted such that total pressure in the intermediate gas inlet area is only slightly below the pressure in the processing region. Accordingly, a controlled flow of gases out of the processing region can be provided and the loss of gases is limited. Thereby, the typical total pressure in an intermediate gas inlet area is between 50% to 99%, for example 75% to 99%, of the total pressure in the processing region.

Figure 8:
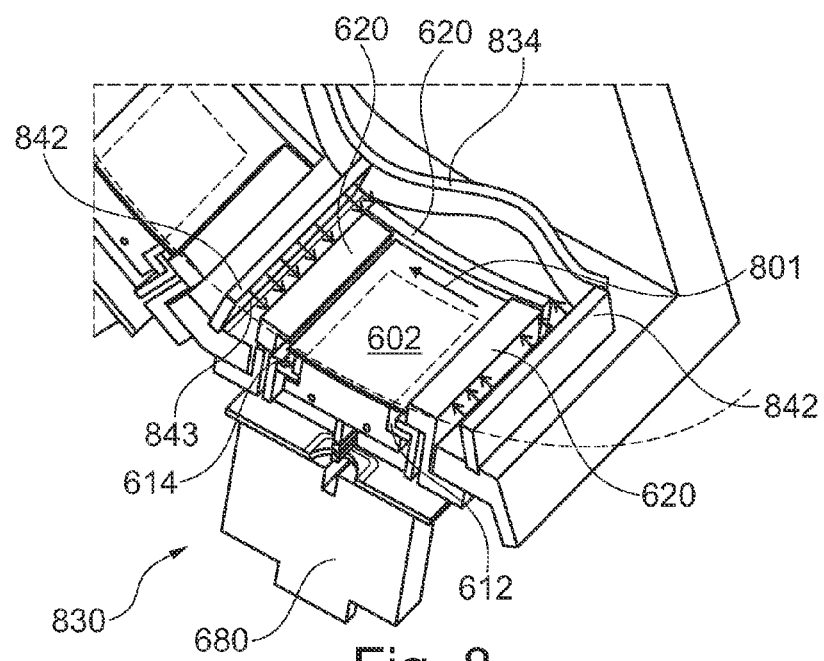
FIG. 8 shows a schematic view of a further roll-to-roll deposition apparatus for depositing or coating the thin-film and having a gas separation unit according to embodiments described herein.

As shown in FIG. 8, a deposition source, such as a plasma deposition source 830, is provided. The deposition source includes an electrode 602. The electrode is connected to a match circuit 680 for providing power to the electrode. Thereby, a plasma can be ignited and maintained in the processing region. The deposition source further includes a gas inlet 612 for providing a processing gas mixture into the processing region and an evacuation outlet 614 for removing the processing gas mixture from the processing region. Accordingly the processing gas flows from inlet 612 to outlet 614 as indicated by arrow 801. FIG. 8 shows the channels of the inlet and the outlet, whereas a slit opening of a respective slit, which is essentially perpendicular to the gas flow direction indicated by arrow 801, cannot be easily seen from the perspective shown in FIG. 8. According to typical implementations, a plurality of openings or a slit opening can be provided.

Around the processing region provided between the electrode 602 and the substrate, one or more gas separation units 620 can be provided. The sectional perspective view as shown in FIG. 8 shows gas separation units at three sides of the electrode 602. According to yet further embodiments, which can be combined with other embodiments described herein, one or more separation gas inlets 842 can be provided. As shown in FIG. 8 two separation gas inlets can be provided. Thereby, separation or purge gas is provided in the intermediate gas inlet areas between the separation gas inlets 842 and the gas separation unit 620 as indicated by arrows 843. A further gas separation unit 834 is provided to provide a gas flow barrier. Accordingly, a corresponding pressure as described above can be provided in these areas. Even though not shown in FIG. 8, separation or purge gas as indicated by arrow 843 can also be provided in an opposing direction for provided purge gas for a neighboring plasma deposition source.

Typically, each deposition source and the corresponding processing region, e.g. a vacuum processing region has its individual corresponding vacuum pump or pumping station for evacuation of the respective area. Further, the chamber 102 of the housing of the apparatus includes a common vacuum pump or pumping station, i.e. the chamber includes the respective flanges. During operation, this pumping station or vacuum pump is used to provide an overall chamber pressure, which is below the lowest pressure in one of the intermediate gas inlet areas. Accordingly, a gas flow from the chamber into an intermediate gas inlet area can be avoided. Yet further, as described above, a gas flow from an intermediate gas inlet area into the processing region can be avoided. Under these boundary conditions, pressures and gas flow rates can be adjusted to provide for the desired gas separation factors.

According to some embodiments described herein, and as shown in FIG. 8, the electrode 602 can be a curved electrode. Thereby, the curved electrode is shaped to have an essentially constant distance from a coating drum for supporting the substrate during processing. The processing regions are provided at different angular positions of the coating drum. According to typical embodiments, the processing drum or coating drum can be configured to be heated and/or cooled to temperatures of 20° C. to 400° C. The temperature differences that can be utilized for different processing applications can result in a thermal expansion of the processing drum. The thermal expansion (positive or negative, i.e. a shrinkage if the drum is cooled from a higher temperature to a lower temperature) can be in the range of several millimeters.

As described herein and according to some embodiments, the at least one of a gas separation unit, an electrodes of a deposition source, or the entire processing station including the deposition source, the gas separation unit and the separation gas inlet are mounted to be movable such that the distance between the substrate support surface and the respective element can be varied. For embodiments with a cylindrical coating drum the respective element can be mounted to be radially movable.

According to different embodiments, which can be combined with other embodiments described herein, the at least one of a gas separation unit and electrodes of a deposition source, or the entire processing station including the depositions source, the gas separation unit and the separation gas inlet can be mounted with a respective bellow. A gas separation is provided between the processing station and the substrate support surface. Accordingly, the substrate support surface extends in the direction perpendicular to the substrate moving direction, at least along the entire length of each processing station including the gas separation units, the intermediate gas inlet areas, the separation gas inlets, and, if present, also further gas separation units around the separation gas inlets (see, e.g. FIG. 12). The variation of the one or more positions of the respective elements to provide for an essentially constant or predetermined distance to the substrate support surface, e.g. the curved surface of a coating drum, can be provided by an actuator or a support as described herein.

Figure 9:
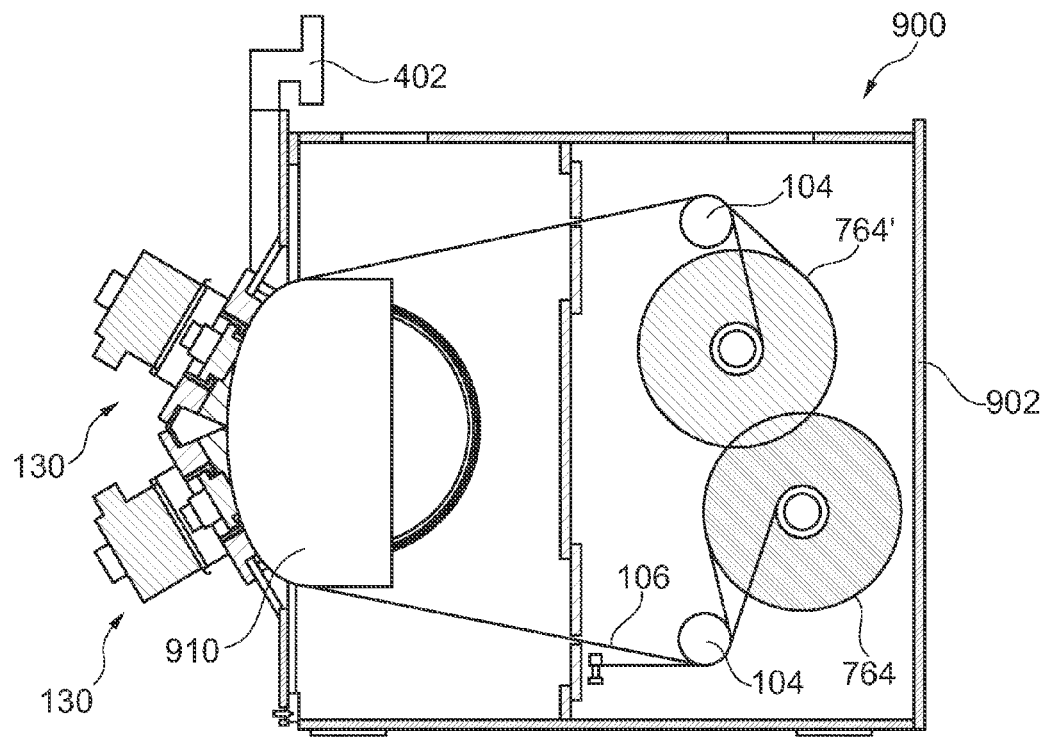
FIG. 9 shows a schematic view of an interior portion of a vacuum chamber of a roll-to-roll deposition apparatus for depositing or coating the thin-film according to embodiments described herein.

In light of the fact that a combination of a rotating processing drum or coating drum and a stationary support, as for example described with respect to FIGS. 3A and 3B, is more complex, a further apparatus 900 for depositing a thin film on a substrate 106 can include a gas cushion device (GCD) instead of a rotating coating drum. A respective apparatus is shown in FIG. 9. The apparatus includes a chamber 902, a first roll 764 for providing a substrate and a second roll 764' for receiving the substrate 106. However, the substrate moving direction can also be reverted. The deposition sources are provided to form processing areas with the gas cushion device 910.

According to typical embodiments, which can be combined with other embodiments described herein, the gas cushion device is a convex shaped element, e.g. in the form of a cylinder segment or another convex cross-sectional shape. The GCD is stationary and has a substrate support surface, e.g. made of metal, a ceramic or the like. The GCD can be provided with cooling channels and a hovering gas conduit arrangement. The introduction of hovering gas, e.g. hydrogen, between the substrate support surface and the substrate results in generation of a gas cushion, such that the substrate hovers over the substrate support surface. Thereby, the gas cushion can provide for an essentially friction free movement of the substrate through one or more of the processing areas and/or can provide for a thermal conduction between the substrate and the surface of the GCD.

The GCD can be fixedly connected with the processing station or portions thereof, e.g. one or more electrodes of a deposition source, one or more gas separation units, and/or on or more separation gas inlets. If the GCD is fixedly connected to the processing stations or the portions thereof, a thermal expansion only affects the connection. As mentioned above, since the connection has a smaller dimension as the entire radius of a coating drum, a thermal expansion has less influence. Yet further, feed-throughs for fluids and electrical signals and power can be more easily provided as compared to the coating drum, which is configured to rotate during operation.

According to different implementations, which can be combined with typical embodiments described herein, a temperature control or adjustment of the GCD or of a processing/coating drum can be provided by a heat transfer fluid, e.g. a heat transfer oil. Yet, further, an electrical heating in combination with cooling channels for a cooling fluid, e.g. a water cooling, can be provided. The temperature is influenced by the heat introduced by the substrate processing, heat loss due to radiation and thermal conductivity to the cooling fluid. One or more temperature sensors can monitor the heat and one or more positions. And one or more heat elements can be controlled to provide for the desired temperature of the substrate or the substrate support surface, respectively. Thereby, it is to be noted that for some applications, the temperature of the substrate support surface is controlled instead of or in additional to the substrate temperature. This avoids for more complex measurement of the substrate temperature.

Figure 10:
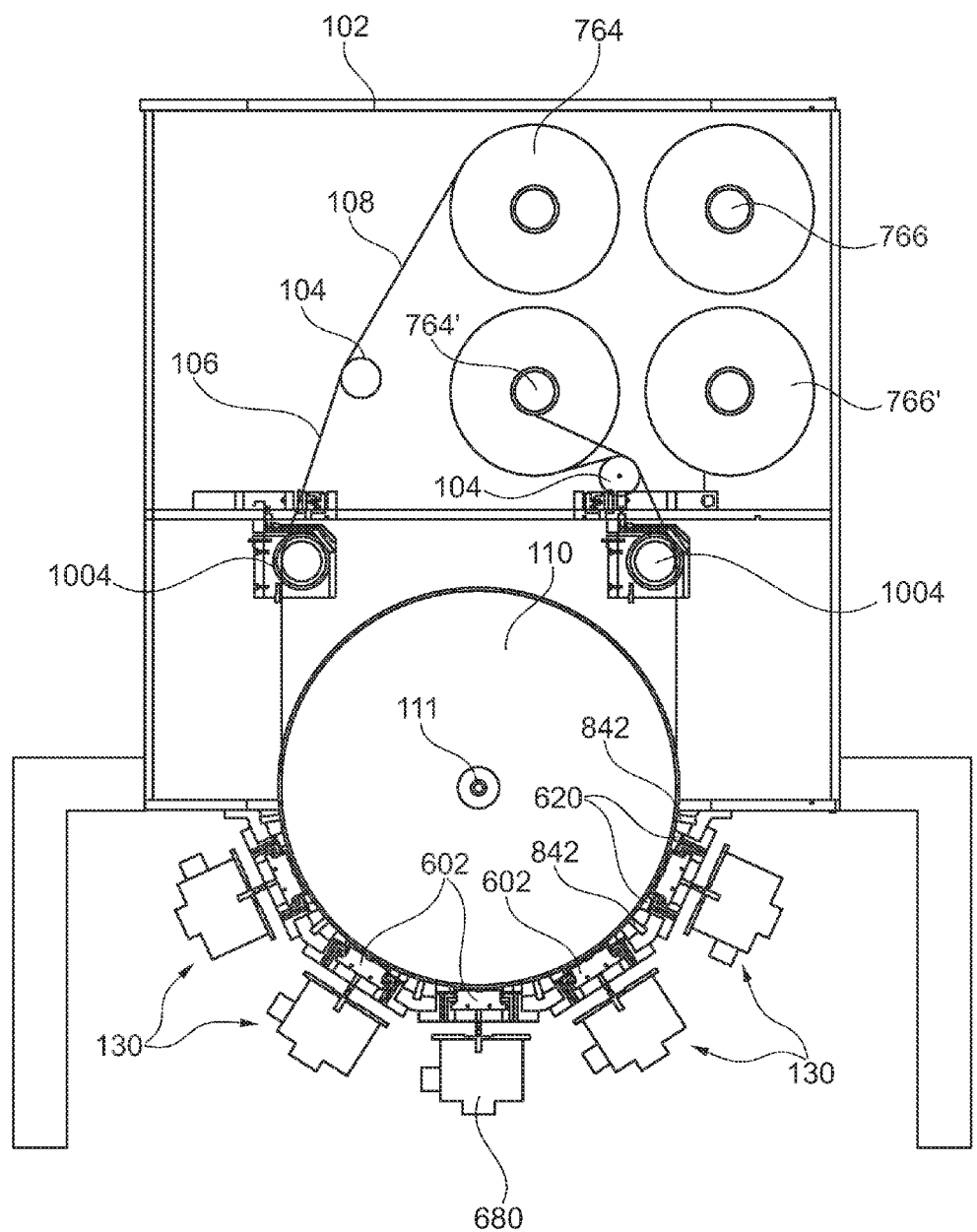
FIG. 10 shows a schematic view of a further roll-to-roll deposition apparatus for depositing or coating the thin-film and having a gas separation unit according to embodiments described herein.

FIG. 10 shows a further deposition apparatus 1000. The flexible substrate 106 is provided on a first roll 764. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. The flexible substrate 106 is unwound from the roll 764 as indicated by the substrate movement direction shown by arrow 108. Upon unwinding of the flexible substrate 106 from the roll 764 the interleaf 706 is wound on the interleaf roll 766.

The substrate 106 is then moved through the deposition areas provided at the coating drum 110 and corresponding to positions of the deposition sources 130. During operation, the coating drum 110 rotates around axis 111 such that the substrate moves in the direction of arrow 108. According to typical embodiments, the substrate is guided via one, two or more rollers 104 from the roll 764 to the coating drum and from the coating drum to the second roll 764', around which the substrate is wound after processing thereof. After processing, a further interleaf can be provided from interleaf roll 766' between the layers of the flexible substrate 106, which is wound on to the roll 764'.

The substrate 106 is coated with one or more thin films, i.e. one or more layers are deposited on the substrate 106 by deposition sources 130. The deposition takes place while the substrate is guided on the coating drum 110. The deposition sources 130 shown in FIG. 10, and which can be provided in embodiments described herein, include one electrode 602, which is electrically connected to match circuit 680 for providing power to the electrode. The deposition source 130, according to some embodiments described herein, can include a gas inlet at one side of the deposition source and a gas outlet at the opposing side of the deposition source, i.e. a respective electrode thereof. Accordingly, a gas flow of processing gas can be provided along the electrode over the deposition source. As shown in FIG. 10, and according to some embodiments described herein, the substrate transport direction 108 is parallel to a gas flow direction. It is noted here that the term "gas inlet" denotes a gas supply into a deposition region (a plasma volume or processing region), whereas the term "gas outlet" denotes a gas discharge or evacuation of deposition gas out of a deposition region. The gas inlet and the gas outlet, according to a typical embodiment, are arranged essentially perpendicular to the substrate transport direction.

According to different embodiments, which can be combined with other embodiments described herein, the gas inlets or gas outlets may be provided as gas lances, gas channels, gas ducts, gas passages, gas tubes, conduits, etc. Furthermore, a gas outlet may be configured as a part of a pump which extracts gas from the plasma volume.

Gas separation units 620 are provided on at least one, typically both sides of the deposition source. Thereby, the slit width of the gas separation units, i.e. the distance between elements, such as elements 124 shown in FIGS. 1 to 5 of the gas separation unit, and the substrate can be adjusted according to any of the embodiments described herein. Additionally or alternatively, also the distance of the electrode 602 with respect to the substrate can be adjusted. Thereby, the support of the gas separation unit and, optionally the deposition source having the electrode therein, can be provided for adjustment of the distance to the substrate.

As described inter alia with respect to FIGS. 6 and 7, embodiments described herein refer inter alia to a plasma deposition system for depositing, from a plasma phase, thin films onto a moving substrate. The substrate may move in a substrate transport direction in a vacuum chamber where a plasma deposition source for transferring a deposition gas into a plasma phase and for depositing, from the plasma phase, a thin film onto the moving substrate is located.

As shown in FIG. 10 and according to yet further embodiments, which can be combined with other embodiments described herein, one or more separation gas inlets 842 can be provided. Typically, the separation gas inlets can be provided between neighboring processing regions and/or deposition sources, respectively. Thereby, separation or purge gas is provided in the intermediate gas inlet areas between the separation gas inlets 842 and the gas separation unit 620.

The rollers 104, which guide the substrate 106 from the roll 764 to the roll 764' or vice versa, are configured for tension measurement. According to typical implementations of embodiments described herein, at least one tension measurement roller is provided in the apparatus. Yet, two tension measurement rollers on both sides of the coating drum allow for tension measurement on the winding side and the unwinding side of the coating drum. Typically, the tension measurement roller is configured for measuring the tension of the flexible substrate. Thereby, the substrate transport can be better controlled, the pressure of the substrate on the coating drum can be controlled and/or damage to the substrate can be reduced or avoided. According to yet further embodiments, which can be combined with other embodiments described herein, an additional tension measurement roller or an additional set of tension measurement rollers, i.e. on the winding side and on the unwinding side of the coating drum, can be provided for the interleaf guiding.

According to yet further embodiments, which can be combined with other embodiments described herein, the rollers 104, which are further used to guide the flexible substrate, can have minimum wrapping of 13°, typically of 15° or above. Thereby, minimum wrapping angle relates to the fact that the enlacement varies depending on and between the two operation conditions when the rolls 764 and 764', respectively, are empty or filled entirely with a substrate. According to yet further embodiments, which can be combined with other embodiments described herein, the gap sluices 1004 provide a vacuum-tight kind of valve such that the gas atmosphere of the winding and unwinding region can be separated from that of the processing region of the apparatus while the flexible substrate is fed through it and clamped in it.

As further shown in FIG. 10, the deposition apparatus is arranged such that the deposition sources are provided at the lower half of the coating drum. In other words, the entire arrangement of all deposition sources or at least the arrangement of the middle three deposition sources is provided below the axis 111 of the coating drum 110. Thereby, generated particles, which could contaminate the substrate and the process, remain in the deposition stations due to gravitation. Thereby, generation of undesired particles on the substrate can be avoided.

Embodiments described herein refer inter alia to deposition apparatus and methods of operation thereof. Thereby, compartments are provided at a chamber or housing where a deposition source can be mounted. According to typical embodiments, which can be combined with other embodiments described herein, two or more compartments are provided. For example, four, five, six, eight or 12 compartments can be provided. The deposition source can be selected from the group consisting of a CVD source, a PECVD source and a PVD source. The concept utilizing compartments allow for exchange of the deposition sources such that the deposition apparatus can be flexibly applied for different applications or different process steps of an application. According to typical implementations, the apparatuses can be used for manufacturing flexible TFT displays, and particularly for barrier layer stacks for flexible TFT displays.

As already described above, the apparatuses and methods according to embodiments described herein can include a plurality of optional features, aspects and details, which might be implemented alternatively or in combination. For example, rolls for winding and unwinding of an interleaf. Accordingly, the methods can include providing an interleaf between layers of substrate on a roll or receiving an interleaf at the unwinding side. Further, the substrate temperature or the temperature of the coating drum can be from 20° C. to 250° C. or even up to 400° C. Typically, the apparatuses are configured for substrate length of 500 m or above, e.g. of 900 m or above, e.g. 1000 m. The substrate width can be 300 mm and above, e.g. 400 mm. Typically, the substrate thickness can be 50 μm to 125 μm.

According to some embodiments, which can be combined with other embodiments described herein, and as for example shown in FIGS. 7, 9 and 10, the coating (or GCD, respectively) and the rollers 104 and 1004 (if present), and rolls 764 and 764' are configured such that the substrate is contacted by the rollers only on the back side thereof, i.e. the side of the substrate opposing the side to be processed in the processing region.

Figure 11A:
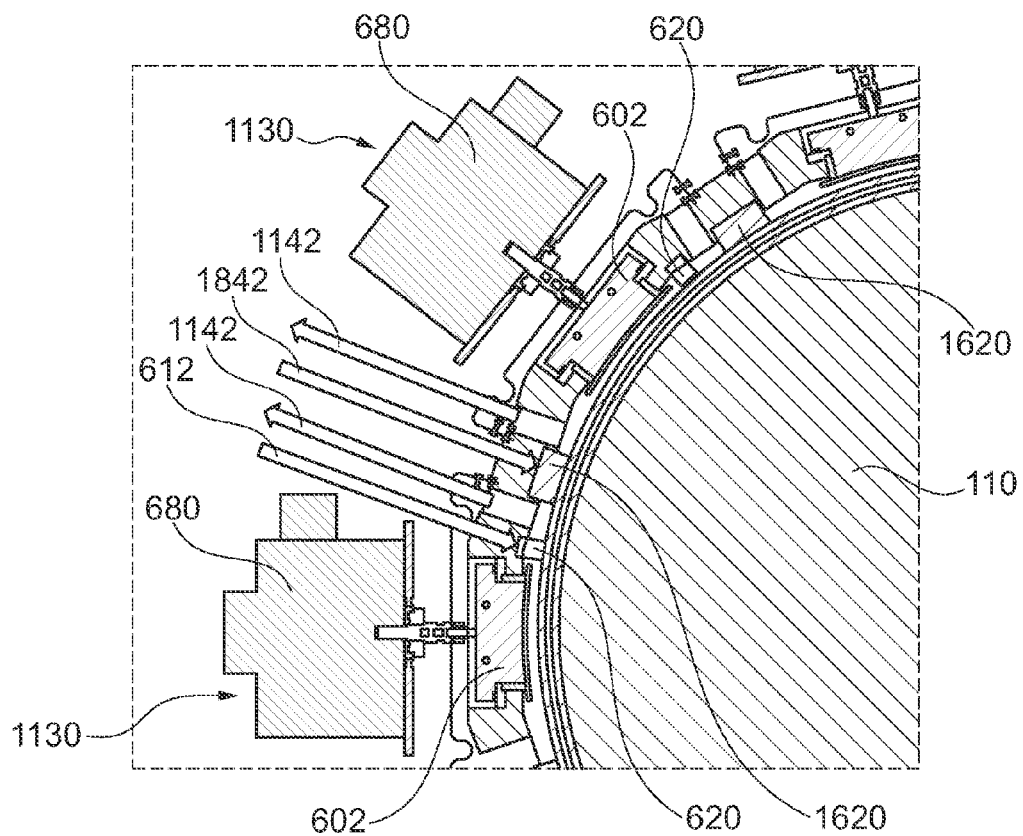
FIGS. 11A to 11C show schematic views of gas separation concepts of a gas separation unit in a roll-to-roll deposition apparatus according to embodiments described herein.
Figure 11B:
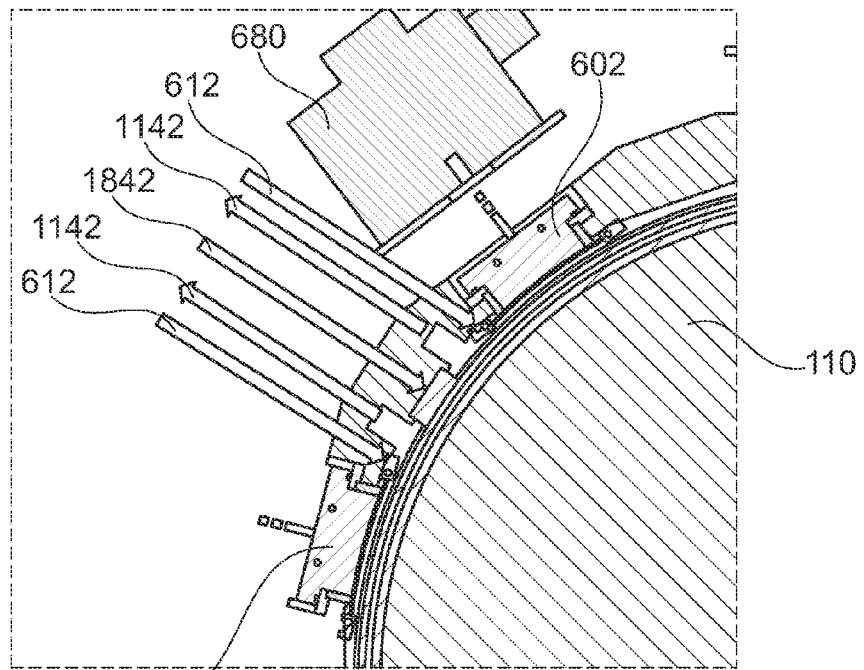
Figure 11C:
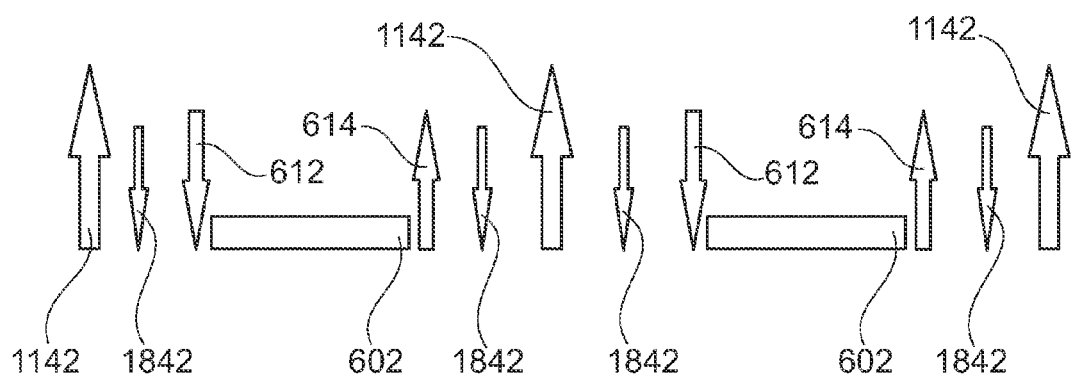

FIGS. 11A to 11C show different embodiments of the flow of processing gas, the flow of purge or separation gas, and suction or pumping regions according to embodiments described herein. FIG. 11A shows two deposition stations provided adjacent to each other at respective processing regions. The processing regions are provided at the coating drum 110. The coating drum 110 forms a curved substrate support surface. However, according to alternative embodiments, which can be combined with other embodiments described herein, a different substrate support providing a flat substrate support surface can also be provided. In this case, the processing stations and respective electrodes will not be shaped to correspond to the curved surface but will be shaped and positioned to correspond to the flat surface.

Each of the processing stations 1130 has an electrode 602. At one side of the electrode a gas inlet 612 is provided. According to typical implementations, the gas inlet can be a slit or a plurality of openings extending in an axial direction of the coating drum 110. Adjacent to the gas inlet 612, a wall portion forming the gas separation unit 620 is provided. The deposition stations 1130 have a match circuit 680, which is connectable to the electrode 602 such that the power for igniting and maintaining a plasma in the processing region can be provided to the electrode.

Between the deposition stations or the respective processing regions a gas inlet 1842 for a separation gas, such as hydrogen, is provided. Further, pumping or suction channels are provided between the processing stations or the respective processing regions. The vacuum channels 1142, e.g., pumping ports are positioned on both sides of the separation gas inlet 1842 in FIG. 11A.

According to some embodiments, which can be combined with other embodiments described herein, the separation gas inlet 1842 can further include a wall portion providing a further gas separation unit 1620. According to typical embodiments, which can be combined with other embodiments described herein, the deposition stations 1130 or at least one of the deposition stations 1130 include an actuator to vary the distance of the deposition stations from the coating drum 110. Thereby, the variation of the distance can be provided by an actuator as described with respect to FIGS. 1 and 2 or can be provided by the support as described with respect to FIGS. 3A and 3B as well as FIGS. 5, 13A and 13B. Thereby, the radial position with respect to the axis of the coating drum 110 of the electrode 602, the first gas separation unit 620 and the second gas separation unit 1620 can be varied and adjusted. For example the variation and adjustment can be utilized for compensating thermal expansion or shrinkage of the coating drum 110 upon temperature variations of the coating drum.

Some embodiments described herein provide a combination of elements or wall portions of gas separation units, pumping or evacuation ducts, and the separation gas inlets in order to provide for the increased separation factor between adjacent processing areas. As shown in FIG. 11A, the separation gas inlet 1842 is provided between the deposition stations and a vacuum channel 1142, e.g. an evacuation duct, is provided on both sides thereof. Thereby, it is to be understood that the processing drum or coating drum 110 extends in a direction perpendicular to the paper plane of FIG. 11A. Further, the electrodes and gas inlets, gas outlets and evacuation ducts extend in the direction perpendicular to the paper plane in FIG. 11A. Accordingly, the relative position of the elements are described with respect to the substrate transport direction and/or a corresponding cross-section as, for example, shown in FIGS. 11A and 11B.

FIG. 11B also shows two deposition stations each having an electrode 602. In FIG. 11B, a match circuit 680 is only shown for one deposition source. FIG. 11B shows another embodiment, wherein contrary to FIG. 11A, a processing gas inlet is provided for both deposition stations between the respective deposition stations, such that the process gas flow direction is provided in the same direction as the substrate transport direction for one of the deposition sources and in the opposite direction for the respective other one of the deposition sources.

FIG. 11C illustrates the schematic concept of various gas inlets and evacuation or suction channels for adjacent deposition sources. FIG. 11C shows two neighboring electrodes 602, which are considered as a portion of a deposition source at the respective position. According to typical embodiments, which can be combined with other embodiments described herein, the electrodes 602 can be electrodes for a plasma assisted deposition process, such as the electrodes of a PECVD source.

As shown in FIG. 11C, the gas inlet 612 for processing gas and the gas outlet 614 for processing gas are provided at the opposing sides of the electrode 602 for each of the neighboring deposition sources. Further, separation gas inlets 1842 are provided, wherein a separation gas inlet 1842 is provided at both sides of the electrode 602, such that the gas inlet 612 and the gas outlet 614, respectively, are positioned between the electrode and the respective separation gas inlet. Vacuum channels 1142, i.e. suction channels or evacuation ducts are provided. Thereby the evacuation ducts are provided at the respective opposing sides of the electrode 602 such that the separation gas inlet 1842 and the gas inlet 612 and the gas outlet 614 are provided between the evacuation ducts and the electrode 602.

FIG. 11C shows the electrode 602 and the respective gas inlets and gas outlets as well as the evacuation ducts positioned along a flat surface. The principles of gas separation described herein can be provided for deposition apparatuses, wherein a flat substrate support surface is provided. However, according to other embodiments, a curved substrate support surface, for example the surface of a processing drum or a coating drum can also be provided. It is to be understood that the electrode 602 as well as the gas inlets, gas outlets, and evacuation ducts can then be shaped and/or positioned to correspond to the curved substrate support surface.

FIG. 11C illustrates the gas inlets, the gas outlets, and the evacuation ducts as arrows. It is to be understood, that the respective channels and ducts can be provided according to any of the embodiments described herein.

Embodiments described herein are particularly useful for applications where different processes are provided in adjacent or neighboring deposition stations. For example, the deposition source illustrated by electrode 602 on the left side in FIG. 11C can conduct a first deposition process, wherein the deposition source illustrated by the electrode 602 on the right side of FIG. 11C can conduct a second, different deposition process. If for example the pressure in the left processing region is 0.3 mbar and the pressure in the right processing region is 1.7 mbar, the pressure in the region of the middle vacuum channel 1142, e.g. evacuation ducts, is typically provided to be below the lower pressure of the two processing areas. In the above example, the pressure can be 0.2 mbar. According to yet further embodiments, which can be combined with other embodiments described herein, in the event that more than two deposition sources are provided, the pressure in the regions of the evacuation ducts is provided to be lower than the smallest pressure in any of the processing regions.

According to yet further embodiments, which can be combined with other embodiments described herein, wall portions or elements of gas separation units can be provided for the arrangement described with respect to FIG. 11C. Thereby, wall portions or elements of gas separation units can be provided between the process gas inlets and the separation gas inlets as well as the process gas outlets and the separation gas inlets, and can further be provided between the separation gas inlets and the evacuation ducts. This can be better understood and will be described in more detail with respect to FIG. 12 below. According to typical embodiments, which can be combined with other embodiments described herein, at least one of the wall portions and/or at least one of the electrodes can be provided such that the distance from the substrate support surface can be adjusted or varied in order to, for example, compensate for thermal expansions and a corresponding variation of the substrate support surface position. Further, it is to be understood that according to embodiments described herein, which can be combined with other embodiments described herein, at least one of the deposition sources or deposition stations is provided as described for embodiments described herein.

Figure 12:
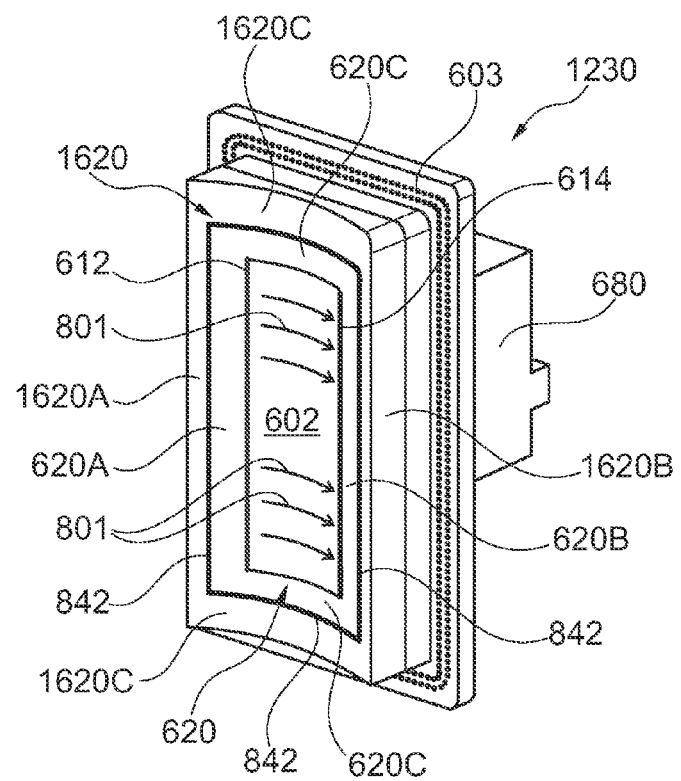
FIG. 12 shows a schematic view of a deposition source according to embodiments described herein for a roll-to-roll deposition apparatus for depositing or coating the thin-film and showing a gas separation unit concept in a three dimensional view.

FIG. 12 shows a deposition station 1230. The deposition station 1230 includes an electrode 602. The electrode can be connected to match circuit 680 such that the electrode 602 is powered. As shown in FIG. 12, the electrode 602 can be provided with a curved surface, such that the electrode corresponds to a processing drum or coating drum, i.e. has an essentially parallel surface with respect to the surface of the drum. Arrows 801 schematically show a gas flow of processing gas in the processing region along the electrode 602. Respective slits of the process gas inlet 612 and the process gas outlet 614 are highlighted by the lines in FIG. 12. Thereby, according to some implementations, which can be combined with other embodiments described herein, particularly for PECVD processes, the process gas flow is asymmetric, i.e. either in direction of the substrate movement or opposite to the direction of the substrate movement.

Generally, embodiments, which can be combined with other embodiments described herein, can include a substrate support having an outer surface for guiding the substrate along a surface of the substrate support through a first vacuum processing region and at least one second vacuum processing region, a first deposition station corresponding to the first processing region and at least one second deposition source corresponding to the at least one second vacuum processing region, wherein at least the first deposition station includes: an electrode having a surface, wherein the surface of the electrode opposes the surface of the substrate support, a processing gas inlet and a processing gas outlet, wherein the processing gas inlet and the processing gas outlet are arranged at opposing sides of the surface of the electrode, a first separation wall surround the surface of the electrode and the processing gas inlet and processing gas outlet, at least one separation gas inlet surrounding the first separation wall; and at least a second separation wall surround the at least one separation gas inlet. The apparatus for deposition further includes one or more vacuum flanges providing at least a further gas outlet between the first deposition station and the at least one second deposition source.

A gas separation unit 620 is provided around the electrode 602. Thereby, the gas separation unit 620 has a first portion 620A on one side of the electrode 602 and a second portion 620B on an opposing side of the electrode 602. Further side portions 620C of the gas separation unit 620 are provided. According to alternative embodiments, separate gas separation units can be provided such that the first portion 620A and the second portion 620B are each formed by a separate gas separation unit. However, the gas separation unit 620 surrounding the electrode 602 provides for an improved separation factor. Thereby, it is to be understood that according to some passages of the specification and the claims, reference is made to a gas separation unit being provided on one side of the electrode 602 and on an opposing side of the electrode 602. It can be understood with respect to FIG. 12 that one single gas separation unit surrounding the electrode 602 can be provided such that it is provided on two opposing sides of the same electrode.

One or more openings of a separation gas inlet 842 are provided at the first side of the electrode 602 and an opposing side of the electrode 602. The separation gas inlet 842 surrounding the electrode 602 is indicated by the dashed line in FIG. 12. Typically, the separation gas inlet 842 is provided at the opposing sides of the electrode 602, or is provided to evenly surround the electrode 602 such that the gas separation unit 620 is between the separation gas inlet 842 and the electrode.

According to yet further embodiments, which can be combined with other embodiments described herein, a further gas separation unit 1620 can be provided. Thereby, a first portion 1620A and a second portion 1620B can be provided at the opposing sides of the electrode 602. Alternatively, two gas separation units can be provided instead of the first and second portions of the further gas separation unit 1620 shown in FIG. 12. The further gas separation unit 1620 shown in FIG. 12 further has side portions 1620C such that the further gas separation unit 1620 surrounds the electrode 602, the first gas separation unit 620 and the separation gas inlet 842.

As shown in FIG. 12, the elements of the deposition station 1230, which are described above, are mounted to the main body 603 of a deposition source or deposition station. The main body can have a frame portion, which can be mounted to the chamber of a deposition apparatus and/or which can be provided in the respective compartment of a deposition apparatus according to embodiments described herein. Thereby, a vacuum region outside of, i.e. surrounding, the further gas separation unit 1620 is provided. This vacuum region is evacuated by evacuation ducts, which correspond to evacuation ducts 1142, as, for example, shown in FIGS. 11A to 11C.

According to different embodiments, which can be combined with other embodiments described herein, at least one of the elements selected from the group consisting of: the gas separation unit 620, the further gas separation unit 1620, and the electrode can be supported and/or connected with the main body 603, an actuator, or a support element connected to an axis of a processing drum or a coating drum such that the distance to the substrate support surface can be varied. Thereby, the gas separation can be improved which is strongly dependent on slit width. For example, a thermal expansion of a coating drum, which can be heated and/or cooled to temperatures of −20° C. to 400° C., e.g. 0° C. to 200° C. or −20° C. to 80° C., can be compensated for.

Thereby, the varying slit width of the slit valve between the gas separation unit and the drum, which varies depending on the temperature, can be compensated for. According to typical embodiments, which can be combined with other embodiments described herein, a gas separation factor of 1:100 or more, for example for PVD, or even a gas separation factor of 1:10.000 or more such as 1:100.000, for example CVD, can be provided.

According to additional or alternative implementations, an automatic adjustment of the slit width or the position of the gas separation units can be provided. Thereby, a measurement device, such as a camera, a distance sensor, or the like can be utilized. Further, if a thermal expansion is to be compensated for, a variation of the position of the gas separation unit can be provided by a support element for the gas separation unit having a thermal expansion corresponding to the thermal expansion varying position of the substrate support surface. Thereby, it has to be considered that the slit width between a gas separation unit and the substrate support surface should be as small as possible (for best separation factor) without risking to damage, scratch or destroy the substrate. In light of the above, embodiments described herein are particularly useful for deposition processes where different pressures are to be used for different deposition processes, e.g. CVD processes or PECVD processes, in neighboring processing regions and/or different processing gases are used for different deposition processes in neighboring processing regions, particularly if one processing gas is poisonous for the process in the neighboring processing region.

According to yet further embodiments, which can be combined with other embodiments described herein, a chamber or housing of a deposition apparatus can have compartments or openings, wherein deposition sources or deposition stations having deposition sources can be positioned in the openings or compartments to provide a connection with the chamber or housing such that the chamber or housing forms a vacuum tight enclosure, i.e. can be evacuated to a vacuum with a pressure of about 0.2 to 10 mbar or even to a vacuum with a pressure of $1*10^{-4}$ to $1*10^{-2}$ mbar. Different pressure ranges are to be considered specifically for PVD processes, in the $10^{-3}$ mbar-range and CVD in the mbar-range, which are conducted in different pressure regimes. Further, the chamber or housing can be evacuated to a background vacuum with a pressure of $1*10^{-6}$ mbar or below. Background pressure means the pressure which is reached by evacuation of the chamber or housing without any inlet of any gases.

Thereby, the deposition apparatus forms a common platform for a variety of processes and PVD processes, such as evaporation or sputtering, or CVD processes, such as a PECVD process, which can be combined while the substrate is moved through two or more processing regions within the deposition apparatus. Particularly, different PECVD processes can be combined and e.g. utilized for TFT or flexible TFT manufacturing, more particularly for ultra high barriers.

According to yet further embodiments, which can be combined with other embodiments described herein, the rollers for winding and unwinding a flexible substrate, the rollers for guiding a substrate, the processing or coating drum, and other elements being in contact with the flexible substrate are positioned and/or arranged in the deposition chamber such that only the back side of the flexible substrate is contacted, i.e. the side which is not processed in the processing regions. According to yet further embodiments, such deposition apparatuses can be provided with bottom-up deposition sources such that particle generation on the substrate is avoided. Thereby, particularly for processing or coating drum applications, bottom-up deposition sources can be understood as deposition sources being arranged below a rotation axis of the coating drum.

According to yet further embodiments, which can be combined with other embodiments described herein, the deposition source with one or more respective electrodes, one or more gas separation units, and optionally provided inputs for separation or purge gas, can be provided as a deposition station, which can be placed into and removed from openings or compartments in the housing or chamber of the deposition apparatus as one assembly.

According to yet further embodiments, which can be combined with other embodiments described herein, the insertion of separation or purge gas is typically conducted by inserting a process gas, such as H2, a noble gas such as argon, or nitrogen in the respective regions defined by the separation gas inlets. Thereby, the separation gas inlets can be slit openings provided between gas separation units, i.e. respective wall elements thereof. According to yet further embodiments, which can be combined with other embodiments described herein, the deposition sources, the gas inlet areas, and the gas separation units are surrounded by areas connected to an evacuation or suction duct such that a background vacuum in the chamber can be provided to be at a pressure lower than any of the pressures in any of the deposition sources or at least of at least 50% of the deposition sources. According to typical implementations, this concept can most easily be provided if at least one first vacuum pump or first pumping station is associated with each of the processing regions or deposition stations, respectively, and at least one second vacuum pump or second pumping station is associated with the chamber to control the overall chamber pressure.

Figure 14A:
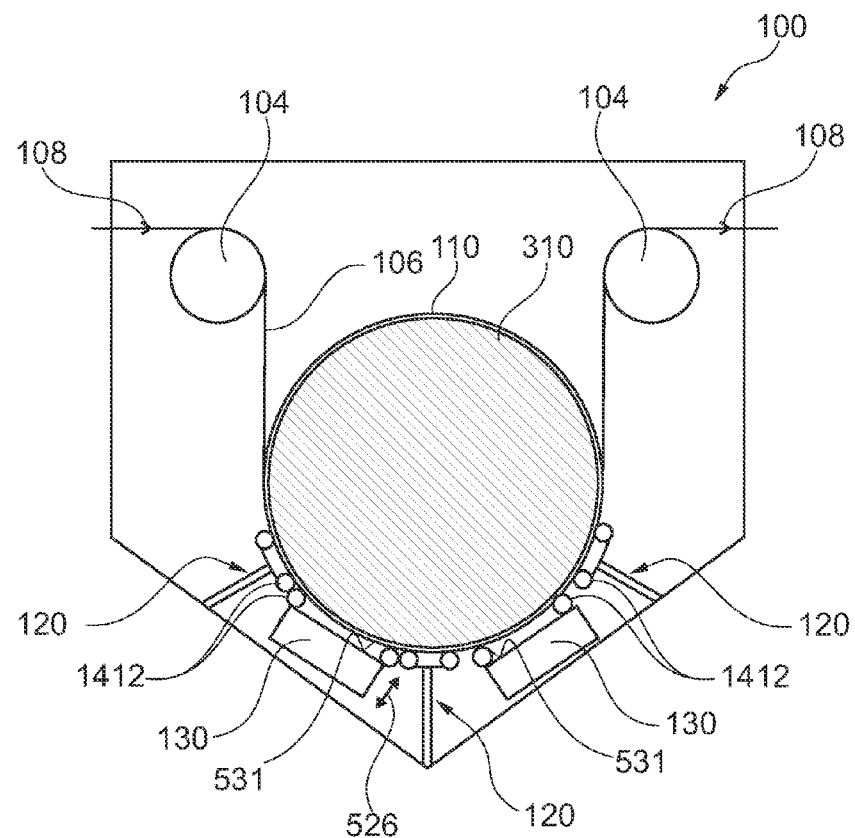
FIGS. 14A and 14B show different schematic views of a further roll-to-roll deposition apparatus for depositing or coating the thin-film and having a plasma deposition source according to embodiments described herein.
Figure 14B:
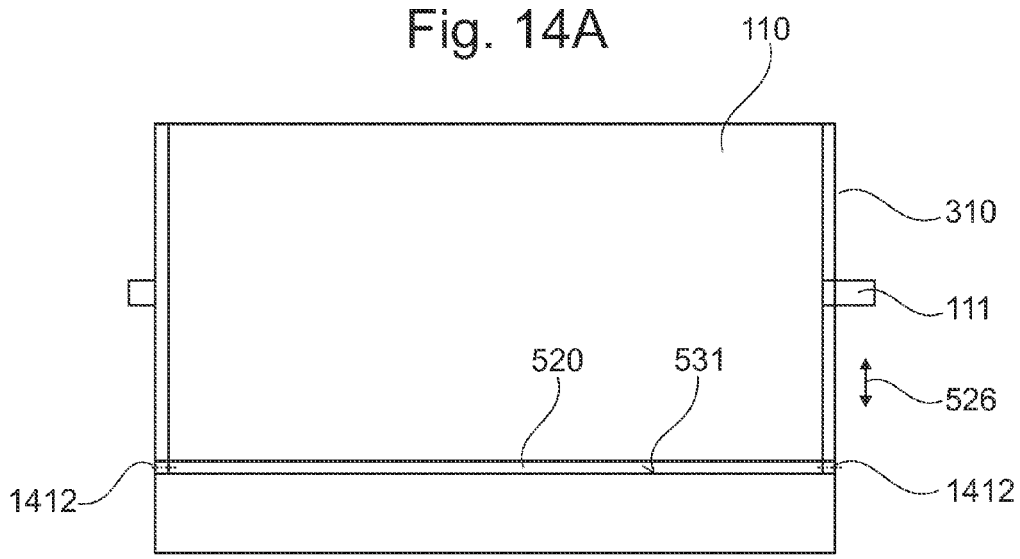

A further deposition apparatus 100 is described with respect to FIGS. 14A and 14B. Similarly to the previously described apparatuses, the substrate 106 is guided as indicated by arrow 108 over rollers 104 and coating drum 110. Deposition sources 130 are provided in processing regions. The processing regions can be separated by gas separation units 120. Typically, the deposition sources include an electrode 531 facing the substrate support or the substrate respectively. Accordingly, the deposition source or the electrode 531, respectively, and the substrate 106 are at opposing sides of a vacuum processing region in which a plasma is ignited during thin film deposition.

According to some embodiments, which can be combined with other embodiments described herein, the width of the slit between the electrode 531 and the substrate 106, i.e. the width of the vacuum processing region, can be adjusted by the support arrangement of the gas separation unit. FIGS. 14A and 14B show the discs 310, which have essentially the same diameter as the coating drum 110. Even though the coating drum 110 is drawn to be slightly larger in FIG. 14A, this is mainly for illustrating purposes as the coating drum 110 and the discs 310 can have the same diameter. The disc 310 is mounted to the axis 111. According to some embodiments, which can be combined with other embodiments described herein, the discs can rotate with the coating drum. Alternatively, the discs can be omitted if the length of the coating drum in axial direction is configured to support the gas separation units and/or deposition sources as described below.

The deposition source, the electrode of the deposition source or a respective element of the deposition source 130 is supported by the disc 310 by rolls 1412. Thereby, according to some embodiments, the rolls 1412 determine the width of the processing region 520 and/or the slit width of the gas separation unit. The rolls can roll on the disc or a portion of the coating drum. Thereby, a rotation of the disc or the rotation drum does not affect the support of the deposition source 130 and/or the gas separation unit 120.

If the temperature of the coating drum 110, varies the diameter of the coating drum 110 varies. Accordingly, the width of the vacuum processing region 520 is affected by the variation of the diameter of the coating drum and, according to embodiments described herein, an adjustment of the distance between the electrode and the substrate, i.e. the width of the vacuum processing region can be provided. The support of the gas separation unit 120, a plasma deposition source 130, or the respective electrode 531, via rolls 1412 provides for an adjustment of the width of the processing region 520 as indicated by arrow 526. FIG. 14B shows a respective rotation axis of the rolls 1412 to indicate that the rolls can roll over the rolling disc or coating drum to provide a stationary rotational position. In the event a disc 310 is utilized, according to some embodiments, the disc 310 can be passively heated or passively cooled by the coating drum 110. Additionally or alternatively, the disc 310 or a similar support for the plasma deposition source 130 and or the gas separation unit 120 can be provided with cooling channels or heating elements. Thereby, the temperature of the disc 310 can be individually controlled. Accordingly the thermal expansion of the disc 310 can be controlled independently of the temperature of the coating drum. Thereby, the width of the distance between the electrode and the substrate or the substrate support surface, respectively, can be adjusted and is mainly defined by the rolls 1412. It is understood that the rolls 1412 provide connection element or support for the gas separation unit, the deposition source, and/or an electrode of the deposition source, particularly a mechanical connection with the coating drum or an axis thereof. Further, embodiments can be derived by other similar supports as described above.

According to different embodiments described herein, inter alia an apparatus for coating a thin film on a substrate is provided. The apparatus includes a substrate support having an outer surface for guiding the substrate through a first vacuum processing region and at least one second vacuum processing region, a gas separation unit for separating the first vacuum processing region from the at least one second vacuum processing region adapted to form a slit through which the substrate can pass between the outer surface of the substrate support and the gas separation unit, wherein the gas separation unit is adapted to control fluid communication between the first processing region and the second processing region, and wherein the fluid communication is controlled by adjusting the position of the gas separation unit. According to typical modifications thereof, at least one of the following features, details, aspects can be provided: the at least one gas separation unit can include an actuator configured to adjust the width of the slit; the substrate support can be a coating drum and wherein the at least one gas separation unit comprises a support element being mechanically connected to the gas separation unit and to the axis of the coating drum; further the support element can e.g. be a disk or a portion of a disk, wherein the disk or the portion of the disk has essentially the same diameter as the coating drum or as the coating drum plus the slit width, wherein the disk or the portion of the disk consists of a material different from that of the coating drum having a different thermal expansion coefficient, wherein the disk or the portion of the disk is kept on the same temperature as the drum or on an adapted temperature different than the drum in order to adjust the diameter of the disk or the portion of the disk to that of the coating drum or the support element; or wherein the disk or the portion of the disk has essentially the same diameter as the coating drum or as the coating drum plus the slit width, wherein the disk or the portion of the disk consists of a material, which is the same material as the material of the coating drum, and wherein either the disk is maintained at the same temperature or the disk or the portion of the disk is kept on an adapted temperature level in order to adjust the diameter of the disk or the portion of the disk to that of the coating drum. According to yet further embodiments, which can be combined with other embodiments described herein, the apparatus can further include a monitoring device for monitoring the width of the slit and/or at least two plasma deposition sources, wherein as a further alternative or additional modification the monitoring device includes an optical or electric monitor for optically or electrically monitoring the slit width; and/or wherein the monitoring device is a plasma monitor connected to at least one of the at least two plasma deposition sources for monitoring one or more plasma conditions. Yet further details, aspects and features can additionally or alternatively include at least one gas inlet for providing a separation gas in the slit between the gas separation unit and the substrate and/or a vacuum channel for connecting a vacuum pump.

According to yet a yet further embodiment, a method of providing a gas separation between two deposition sources of a deposition apparatus is provided. The method includes guiding a substrate over a substrate support (see, e.g. step 1502 in FIG. 15), and varying the distance of a gas separation unit configured for the gas separation from the substrate support (see, e.g. step 1504 in FIG. 15), particularly wherein the distance is varied in dependence of the temperature and/or position of the substrate support. According to yet further additional or alternatives modifications thereof, the distance can be varied by an actuator; the radial distance can be varied by thermal expansion of a holder for the separation unit; and/or the substrate support can be a coating drum. According to an even further embodiment, a method of depositing a thin film on a substrate in a deposition apparatus is provided. The method includes guiding a substrate over a substrate support (see, e.g. step 1502 in FIG. 15); and varying the distance of an electrode of a plasma deposition source from the substrate support (see, e.g. step 1506 in FIG. 15), particularly wherein the distance is varied in dependence of the temperature and/or position of the substrate support. According to yet further additional or alternatives modifications thereof, the distance can be varied by an actuator and/or the substrate support can be a coating drum and wherein the distance is a radial distance being varied by thermal expansion of a holder for the plasma deposition source. As described above, additionally to the variation of the distance of the electrode in step 1506 the distance of a gas separation unit configured for the gas separation from the substrate support can be varied in step 1504. Even though FIG. 15 shows both steps 1504 and 1506 it is understood that according to embodiments described herein, either step 1504, or step 1506, or both steps 1504 and 1506 can be provided according to embodiments described herein. Further, as another optional implementation the position of a deposition station as described herein, which includes one or more gas separation units, an electrode and other elements can be varied as one unit.

According to a yet further embodiment, an apparatus for depositing a thin film on a substrate is provided. The apparatus includes a substrate support having an outer surface for guiding the substrate along a surface of the substrate support through a first vacuum processing region and at least one second vacuum processing region, and a first deposition source corresponding to the first processing region and at least one second deposition source corresponding to the at least one second vacuum processing region, wherein at least the first deposition source includes an electrode having a surface, wherein the surface of the electrode opposes the surface of the substrate support, a processing gas inlet and a processing gas outlet, wherein the processing gas inlet and the processing gas outlet are arranged at opposing sides of the surface of the electrode, and at least one separation gas inlet having one or more separation gas inlet openings, wherein the one or more separation gas inlet openings are at least provided at one of opposing sides of the surface of the electrode such that the processing gas inlet and/or the processing gas outlet are provided between the one or more separation gas inlet openings and the surface of the electrode. The apparatus further includes one or more vacuum flanges providing at least a further gas outlet between the first deposition source and the at least one second deposition source. According to typical modifications thereof, at least one of the following features, details, aspects can be provided: the one or more vacuum flanges can be provided between a first separation gas inlet of the at least one separation gas inlet of the first deposition source and a second separation gas inlet of the at least one separation gas inlet of the second deposition source; the separation gas inlet of at least the first deposition source includes the one or more separation gas inlet openings such that the one or more separation gas inlet openings surround or are distributed around the surface of the electrode; at least the first deposition source can further include: at least one first separation wall, wherein the at least one first separation wall is provided at opposing sides of the surface of the electrode such that the processing gas inlet and the processing gas outlet is provided between the at least one first separation wall and the surface of the electrode, particularly wherein the at least one first separation wall surrounds the surface of the electrode, wherein the processing gas inlet and the processing gas outlet are provided within the perimeter of the first separation wall; and/or at least the first deposition source can further include: at least one second separation wall, wherein the at least one second separation wall is provided at opposing sides of the surface of the electrode such that the at least one separation gas inlet is provided between the at least one second separation wall and the at least one first separation wall, particularly wherein the at least one second separation wall surrounds the surface of the electrode, wherein the at least one separation gas inlet is provided within the perimeter of the second separation wall. According to yet further embodiments, which can be combined with other embodiments described herein, the surface of the substrate support is a curved surface of a coating drum and the surface of the electrode is a curved surface, and particularly wherein the curved surface of the coating drum and the curved surface of the electrode of at least the first deposition source have a distance, and wherein the distance can be adjusted by positioning at least the first deposition source; at least the first deposition source can be included in a deposition station, and wherein the deposition station includes the deposition source, the corresponding processing gas inlet, the corresponding processing gas outlet, and the at least one separation gas inlet, which are formed as one unit, particularly wherein the at least one separation wall forms a gas separation unit comprises an actuator configured to adjust position of the gas separation unit, particularly wherein the gas separation unit comprises a support element being mechanically connected to the gas separation unit and to the substrate support; and/or the substrate can be a flexible substrate, and wherein the flexible substrate is guided from an unwinding roll to a winding roll via the coating drum and an arrangement of a plurality of rollers, and wherein the arrangement of plurality of rollers are arranged such that only the backside of the flexible substrate is contacted.

According to a yet further embodiment, a yet further method of depositing at least two layers on a substrate with a first deposition source and at least one second deposition source is provided. The method includes guiding the substrate over a substrate support along a surface (see, e.g., step 1602 in FIG. 16), providing a separation gas at at least two positions at opposing sides of at least the first deposition source (see, e.g. step 1606 in FIG. 16), providing a process gas and exhausting the process gas between the at least two positions (see, e.g. step 1604 in FIG. 16), and pumping at at least one vacuum outlet between the first deposition source and the at least one second deposition source (see, e.g. step 1608 in FIG. 16). According to typical implementations thereof, the separation gas can be hydrogen, nitrogen or a noble gas; and/or the pressure at the at least one vacuum outlet can be smaller than the pressure in any area of the first deposition source and the at least one second deposition source.

According to yet further embodiment, an apparatus for depositing a thin film on a substrate is provided. The apparatus includes a substrate support having an outer surface for guiding the substrate through a vacuum processing region, a plasma deposition source for depositing the thin film on the substrate in the vacuum processing region, wherein the plasma deposition source comprises an electrode, and an actuator configured for adjusting the distance between the electrode and the outer surface. The apparatus may include one or more of the below aspects, details and features: the substrate support can be a coating drum and the substrate is a flexible substrate; the plasma deposition source can include a support element being mechanically connected to the electrode and to an axis of the coating drum; the support element can be a disk or a portion of a disk, wherein the disk or the portion of the disk has essentially the same diameter as the coating drum or as the coating drum plus width of the vacuum processing region, wherein the disk or the portion of the disk consists of a material different from that of the coating drum having a different thermal expansion coefficient, wherein the disk or the portion of the disk is kept on an adapted temperature level in order to adjust the diameter of the disk or the portion of the disk to that of the coating drum or the support element can be a disk or a portion of a disk, wherein the disk or the portion of the disk has essentially the same diameter as the coating drum or as the coating drum plus the slit width, wherein the disk or the portion of the disk consists of a material, which is the same material as the material of the coating drum, and wherein either the disk is maintained at the same temperature or the disk or the portion of the disk is kept on an adapted temperature level in order to adjust the diameter of the disk or the portion of the disk to that of the coating drum; the apparatus can further include a monitoring device for monitoring the width of the vacuum processing region; particularly wherein the monitoring device can include an optical or electrical monitor for optically or electrically monitoring width of the vacuum processing region; e.g. the monitoring device can be a plasma monitor connected to the plasma deposition sources for monitoring one or more plasma conditions. According to yet further embodiments, which can be combined with other embodiments described herein, the apparatus can further include a gas separation unit for separating the vacuum processing region from a further second vacuum processing region adapted to form a slit through which the substrate can pass between the outer surface of the substrate support and the gas separation unit, wherein the gas separation unit is adapted to control fluid communication between the processing region and the further processing region, wherein the fluid communication is controlled by adjusting the position of the gas separation unit; particularly wherein the at least one gas separation unit comprises an actuator configured to adjust the width of the slit and/or wherein the substrate support is a coating drum and wherein the at least one gas separation unit comprises a support element being mechanically connected to the gas separation unit and to the axis of the coating drum.

While the foregoing is directed to embodiments of the invention, other and further embodiments of the invention may be devised without departing from the basic scope thereof, and the scope thereof is determined by the claims that follow.

The invention claimed is:

1. An apparatus for depositing a thin film on a substrate, comprising:
    a substrate support having an outer surface for guiding the substrate along a surface of the substrate support through a first vacuum processing region and at least one second vacuum processing region;
    a first deposition source corresponding to the first processing region and at least one second deposition source corresponding to the at least one second vacuum processing region, wherein at least the first deposition source comprises:
        an electrode having a surface, wherein the surface of the electrode opposes the surface of the substrate support;
        a processing gas inlet and a processing gas outlet, wherein the processing gas inlet and the processing gas outlet are arranged at opposing sides of the surface of the electrode, wherein at least the first deposition source is configured for providing a gas flow of processing gas from the processing gas inlet to the processing gas outlet along the surface of the electrode;
        at least one separation gas inlet having one or more separation gas inlet openings, wherein the one or more separation gas inlet openings are at least provided at opposing sides of the surface of the electrode such that the processing gas inlet and the processing gas outlet are provided between the one or more separation gas inlet openings and the surface of the electrode; and
        at least one first separation wall, wherein the at least one first separation wall is provided at opposing sides of the surface of the electrode such that the processing gas inlet and the processing gas outlet are provided between the at least one first separation wall and the surface of the electrode, wherein the at least one first separation wall is provided between the at least one separation gas inlet and the surface of the electrode, wherein at least one intermediate gas inlet area is provided between the at least one separation gas inlet and the at least one first separation wall, and wherein the at least one or more separation gas inlet openings are arranged to provide a separation gas in the at least one intermediate gas inlet area and to direct separation gas from the at least one or more separation gas inlet openings across the at least one intermediate gas inlet area towards the at least one first separation wall; and one or more vacuum flanges providing at least a further gas outlet between the first deposition source and the at least one second deposition source, wherein the one or more vacuum flanges are configured such that one or more vacuum pumps are connected to the one or more vacuum flanges to generate a vacuum with a pressure of 10 mbar or below in either the first vacuum processing region or the at least one second vacuum processing region.

2. The apparatus according to claim 1, wherein the one or more vacuum flanges are provided between a first separation gas inlet of the at least one separation gas inlet of the first deposition source and a second separation gas inlet of at least one separation gas inlet of the second deposition source.

3. The apparatus according to claim 1, wherein the separation gas inlet of at least the first deposition source has the one or more separation gas inlet openings such that the one or more separation gas inlet openings surround or are distributed around the surface of the electrode.

4. The apparatus according to claim 1, wherein the at least one first separation wall surrounds the surface of the electrode, wherein the processing gas inlet and the processing gas outlet are provided within the perimeter of the first separation wall.

5. The apparatus according to claim 1, wherein at least the first deposition source further comprises:

at least one second separation wall, wherein the at least one second separation wall is provided at opposing sides of the surface of the electrode such that the at least one separation gas inlet is provided between the at least one second separation wall and the at least one first separation wall.

6. The apparatus according to claim 5, wherein the at least one second separation wall surrounds the surface of the electrode, wherein the at least one separation gas inlet is provided within the perimeter of the second separation wall.

7. The apparatus according to claim 1, wherein the surface of the substrate support is a curved surface of a coating drum and the surface of the electrode is a curved surface.

8. The apparatus according to claim 7, wherein the substrate is a flexible substrate, and wherein the flexible substrate is guided from an unwinding roll to a winding roll via the coating drum and an arrangement of a plurality of rollers, and wherein the arrangement of plurality of rollers are arranged such that only the backside of the flexible substrate is contacted.

9. The apparatus according to claim 7, wherein the curved surface of the coating drum and the curved surface of the electrode of at least the first deposition source are separated by a distance, and wherein the distance can be adjusted by positioning at least the first deposition source.

10. The apparatus according to claim 7, wherein the curved surface is shaped such that the electrode has an essentially parallel surface with respect to the surface of the coating drum.

11. The apparatus according to claim 1, wherein at least the first deposition source is included in a deposition station, and wherein the deposition station includes the first deposition source, the processing gas inlet, the processing gas outlet, and the at least one separation gas inlet, which are formed as one unit.

12. The apparatus according to claim 1, wherein the at least one separation wall forms a gas separation unit comprising an actuator configured to adjust a position of the gas separation unit.

13. The apparatus according to claim 12, wherein the gas separation unit comprises a support element which mechanically connects the gas separation unit to the substrate support.

14. An apparatus for depositing a thin film on a substrate, comprising:

a substrate support having an outer surface for guiding the substrate along a surface of the substrate support through a first vacuum processing region and at least one second vacuum processing region;

a first deposition station corresponding to the first vacuum processing region and at least one second deposition station corresponding to the at least one second vacuum processing region, wherein at least the first deposition station comprises:

an electrode having a surface, wherein the surface of the electrode opposes the surface of the substrate support;

a processing gas inlet and a processing gas outlet, wherein the processing gas inlet and the processing gas outlet are arranged at opposing sides of the surface of the electrode, wherein at least the first deposition station is configured for providing a gas flow of processing gas from the processing gas inlet to the processing gas outlet along the surface of the electrode;

a first separation wall surrounding the surface of the electrode and the processing gas inlet and processing gas outlet, wherein the processing gas inlet and the processing gas outlet are provided between the first separation wall and the surface of the electrode;

at least one separation gas inlet surrounding the first separation wall, wherein an at least one intermediate gas inlet area is provided between the at least one separation gas inlet and the first separation wall, and wherein the at least one separation gas inlet is arranged to provide a separation gas in the at least one intermediate gas inlet area and to direct separation gas from the at least one gas inlet across the at least one intermediate gas inlet area towards the first separation wall; and at least a second separation wall surrounding the at least one separation gas inlet; and one or more vacuum flanges providing at least a further gas outlet between the first deposition station and the at least one second deposition station, wherein the one or more vacuum flanges are configured such that one or more vacuum pumps are connected to the one or more vacuum flanges to generate a vacuum with a pressure of 10 mbar or below in either the first vacuum processing region or the at least one second vacuum processing region.

15. The apparatus according to claim 14, wherein the surface of the substrate support is a curved surface of a coating drum and the surface of the electrode is a curved surface.

16. The apparatus according to claim 15, wherein the curved surface of the coating drum and the curved surface of the electrode of at least the first deposition station are separated by a distance, and wherein the distance is adjustable by positioning at least the first deposition source.

17. The apparatus according to claim 15, wherein the curved surface is shaped such that the electrode has an essentially parallel surface with respect to the surface of the coating drum.

18. An apparatus for depositing a thin film on a substrate, comprising:
- a substrate support having an outer surface for guiding the substrate along a surface of the substrate support through a first vacuum processing region and at least one second vacuum processing region;
- a first deposition source corresponding to the first processing region and at least one second deposition source corresponding to the at least one second vacuum processing region, wherein at least the first deposition source comprises:
    - an electrode having a surface, wherein the surface of the electrode opposes the surface of the substrate support, and wherein the electrode has a first electrode side and an opposing second electrode side with the surface of the electrode between the first electrode side and the second electrode side;
    - a processing gas inlet and a processing gas outlet, wherein the processing gas inlet is arranged at the first electrode side and the processing gas outlet is arranged at the opposing second electrode side, wherein at least the first deposition source is configured for providing a gas flow of processing gas from the processing gas inlet to the processing gas outlet along the surface of the electrode;
    - a first separation wall at the first electrode side and a second separation wall at the opposing second electrode side, wherein the processing gas inlet is provided between the first separation wall and the first electrode side, and the processing gas outlet is provided between the second separation wall and the second electrode side;
    - a first separation gas inlet having one or more first separation gas inlet openings and the first separation gas inlet spaced outwardly from the first separation wall to provide a first intermediate gas inlet area such that the first separation wall is disposed between the processing gas inlet and the first separation gas inlet;
    - a second separation gas inlet having one or more second separation gas inlet openings and the second separation gas inlet spaced outwardly from the second separation wall to provide a second intermediate gas inlet area such that the second separation wall is disposed between the processing gas outlet and the second separation gas inlet; and
- one or more vacuum flanges providing at least a further gas outlet between the first deposition source and the at least one second deposition source.

19. The apparatus according to claim 18, wherein the one or more second separation gas inlet openings are arranged to provide a separation gas in the second intermediate gas inlet area and to direct separation gas from the one or more second separation gas inlet openings across the second intermediate gas inlet area towards the second separation wall.

20. The apparatus according to claim 19, wherein the one or more second separation gas inlet openings are arranged to direct separation gas from the one or more separation gas inlet openings in a direction opposite the gas flow of processing gas from the processing gas inlet.

* * * * *